United States Patent [19]
Adams et al.

[11] Patent Number: 5,471,411
[45] Date of Patent: Nov. 28, 1995

[54] INTERPOLATION FILTER WITH REDUCED SET OF FILTER COEFFICIENTS

[75] Inventors: Robert W. Adams, Acton, Mass.; Tom W. Kwan, Santa Clara, Calif.; Michael Coln, Lexington, Mass.

[73] Assignee: Analog Devices, Inc., Norwood, Mass.

[21] Appl. No.: 234,177

[22] Filed: Apr. 28, 1994

Related U.S. Application Data

[62] Division of Ser. No. 954,149, Sep. 30, 1992.

[51] Int. Cl.$^6$ ................................................ G06F 15/31
[52] U.S. Cl. .................... 364/724.01; 364/724.1
[58] Field of Search ..................... 364/718, 719, 364/720, 721, 723, 724.01, 724.1

[56] References Cited

U.S. PATENT DOCUMENTS

| | | | |
|---|---|---|---|
| 3,374,426 | 2/1963 | Burlage et al. | 364/724 |
| 3,632,905 | 1/1972 | Thomas et al. | 179/170.2 |
| 3,829,670 | 8/1974 | Kebabian | 235/152 |
| 3,928,755 | 12/1975 | Bellanger et al. | 235/152 |
| 3,988,607 | 10/1976 | Eggermont et al. | 235/156 |
| 3,997,773 | 12/1976 | Van Essen et al. | 235/156 |
| 4,020,332 | 4/1977 | Crochiere et al. | 235/152 |
| 4,131,764 | 12/1978 | Claasen et al. | 179/15 FS |
| 4,224,585 | 9/1980 | Tanaka | 333/165 |
| 4,270,026 | 5/1981 | Shenoi et al. | 179/15.55 |
| 4,344,149 | 8/1982 | Van De Meeberg et al. | 364/724 |
| 4,386,430 | 5/1983 | Treiber | 375/14 |
| 4,460,890 | 7/1984 | Busby | 340/347 |
| 4,472,785 | 9/1984 | Kasuga | 364/718 |
| 4,482,975 | 11/1984 | King et al. | 364/718 X |
| 4,527,020 | 7/1985 | Ito | 179/170.2 |
| 4,528,639 | 7/1985 | Edwards | 364/723 |
| 4,564,918 | 1/1986 | McNally et al. | 364/569 |
| 4,584,659 | 4/1986 | Stikvoort | 364/724 |
| 4,602,285 | 7/1986 | Beaulier et al. | 358/160 |
| 4,604,720 | 8/1986 | Stikvoort | 364/724 |

(List continued on next page.)

FOREIGN PATENT DOCUMENTS

| | | |
|---|---|---|
| 1186751 | 7/1985 | Canada ........................................ 328/3 |
| 0052847 | 2/1982 | European Pat. Off. .. |
| 0084592 | 3/1983 | European Pat. Off. .. |
| 0542681 | 7/1989 | European Pat. Off. .. |
| 0441155 | 8/1991 | European Pat. Off. .. |

OTHER PUBLICATIONS

Tor A. Ramstad, "Digital Methods for Conversion Between Abritrary Sampling Frequencies," IEEE Transactions on Acoustics, Speech, and Signal Processing, vol. ASSP-32, No. 3, Jun. 1984, pp. 577-591.

(List continued on next page.)

*Primary Examiner*—Roy N. Envall, Jr.
*Assistant Examiner*—Chuong D. Ngo
*Attorney, Agent, or Firm*—Wolf, Greenfield & Sacks

[57] ABSTRACT

An asynchronous digital sample rate converter includes a random access memory for storing input data values and a read only memory for storing a reduced set of interpolation filter coefficients. Input data is written to the random access memory at the input sample rate. Output samples are provided from a multiply/accumulate engine which given a stream of input data and filter coefficients produces an output sample upon request at the output frequency. The initial address for reading input data from the random access memory, and the addresses for coefficients from the read only memory are provided by an auto-centering scheme which is a first order closed loop system with a digital integrator fed by an approximation of the input to output sample rate ratio. This auto-centering scheme may include a feed forward low pass filter to cancel steady state error, and an interpolated write address to reduce noise. A circuit determining the output to input sample rate ratios can also be provided to scale coefficient addresses and resulting output samples to allow for decimation. This circuit includes a form of digital hysteresis to eliminate noise. The ROM coefficients are reduced by relying on the symmetry of the impulse response of the interpolation filter and by utilizing a variable step size forward and backward linear interpolation.

3 Claims, 28 Drawing Sheets

U.S. PATENT DOCUMENTS

| | | | |
|---|---|---|---|
| 4,748,578 | 5/1988 | Lagadec et al. | 364/724 |
| 4,780,892 | 10/1988 | Lagadec | 375/118 |
| 4,802,109 | 1/1989 | Machida | 364/723 |
| 4,825,398 | 4/1989 | Koch et al. | 364/724.1 |
| 4,837,619 | 6/1989 | Tsinberg | 358/140 |
| 4,866,647 | 9/1989 | Farrow | 364/724.14 |
| 4,953,117 | 8/1990 | Lagadec | 364/724.1 |
| 5,023,825 | 6/1991 | Luthra et al. | 364/724.1 |
| 5,182,633 | 1/1993 | Antonio et al. | 358/11 |
| 5,321,642 | 6/1994 | Goldberg | 364/721 |

OTHER PUBLICATIONS

Wong, K. M. et al., "Commutativity and Application of Digital Interpolation Filters and Modulators," I.E.E.E. Transactions on Communications, vol. COM–28, No. 2, pp. 244–249, Feb. 1980.

Lagadec, R. et al., "A Universal, Digital Sampling Frequency Converter for Digital Audio," Proc. ICASSP 1981, pp. 595–598.

Crochiere, R. et al., "Further Considerations in the Design of Decimators and Interpolators," I.E.E.E. Transactions on Acoustics, Speech and Signal Processing, vol. ASSP–24, No. 4, pp. 296–311, Aug. 1976.

Rabiner, L. et al., Theory and Application of Digital Signal Processing, Preutice–Hall, Inc., Englewood Cliffs, N.J., 1975, pp. 541–544.

Rabiner, L. et al., "Terminology in Digital Signal Processing," I.E.E.E. Transactions on Audio and Electroacoustics, vol. AU–20, No. 5, pp. 322–337, Dec., 1972.

Schafer, R. et al., "A Digital Processing Approach to Interpolation," Proceedings of the I.E.E.E., vol. 61, No. 6, pp. 692–702, Jun. 1973.

Lagadec, R. "Digital Sampling Frequency Conversion," AES Premier Conference on Digital Audio, Proceedings, (Rye, N.Y., 1982) pp. 90–96.

Wilkinson, J. "Communications in the Digital Audio Studio," presented at the 7th International Conference: Audio in Digital Times, May 1989.

Shelton, T., "Synchronization of Digital Audio", Presented at the AES 7th International Conference: Audio in Digital Times, May, 1989.

Smith, J., "A Flexible Sampling–Rate Conversion Method," pp. 19.4.1–19.4.4.

Goodman, D. et al., "Nine Digital Filters For Decimation and Interpolation," I.E.E.E. Trans. Acoust., Speech and Signal Proc., vol. ASSP–25 pp. 121–126, Apr. 1977.

Crochiere, R. et al. "Interpolation and Decimation of Digital Signals—A Tutorial Review," Proc. I.E.E.E., vol. 69, pp. 300–311, Mar. 1981.

J. O. Smith and P. Gossett, "A Flexible Sampling–Rate Conversion Method", ICASSP 1984.

INTERPOLATION FILTER WITH REDUCED SET OF FILTER COEFFICIENTS

This application is a divisional of application Ser. No. 07/954,149 filed on Sep. 30, 1992.

FIELD OF THE INVENTION

The invention is related to circuits for converting data samples received at a first sample rate into corresponding data samples provided at a second rate. More particularly, the invention is a sample rate converter capable of converting a sequence of digital data samples presented at an input sample rate into a different sequence of digital data provided at an output sample rate which is not a rational multiple or submultiple of the input sample rate.

BACKGROUND OF THE INVENTION

It is becoming common for audio recording studios to digitize signals produced by analog sources, such as microphones. In these studios, audio recording, production, editing and processing is performed completely in the digital domain. For this reason, most modern digital audio equipment comes equipped to receive digital input signals and to provide digital output signals; analog-to-digital converters and digital-to-analog converters are often optional. There is, however, no established standard digital sampling rate for all types of information. The need for simple digital interfacing between different equipment has thus become very important.

The most common solution to the digital interface problem is to use a phase-locked loop to recover the sample rate of input data, and to use the resulting high frequency clock as an internal system clock. One problem that often arises is that an internal system clock must be fixed at a frequency that is not related to the frequency of the input serial data. An example of this problem occurs in digital videotape recorders, where the internal system clock must be related to a standard video frequency, and must be able to lock up with a master video synchronizing generator whose frequency is not related to the frequency of serial input data, such as digital audio data. Therefore, such digital videotape recorders, and similar devices, need a sample rate converter to convert input audio signals sample at some unknown rate (though typically 44.1 kHz) to corresponding digital samples at a local, fixed sample rate.

There are two classes of sample rate converters: synchronous and asynchronous. In synchronous sample rate converters, an input sample rate is related to an output sample rate by a ratio of integers (3:2, for example), i.e., a rational number. While such a device is sometimes useful, the output rate is still related to the input rate. Equipment which uses this data still must lock to the rate of the input data.

Asynchronous sample rate converters, on the other hand, are designed to receive a stream of input data samples and produce output data samples when requested by the system (i.e., not necessarily at a fixed rate rationally related to the input rate). It is therefore capable of converting between any two sample rates, and the ratio of these rates may be irrational. Thus, the main purpose of an asynchronous digital sample rate converter is to decouple the sampling rate of the input and output data streams from the clock frequencies used in the processing or storage of these data streams. Further, an asynchronous converter may correctly follow the slow variations of the input and output sample rates. This type of sample rate converter is in the most commercial demand today.

A simple analog method to change from one sample rate to another is shown in FIG. 1. It uses a digital-to-analog (D/A) converter 50 followed by a brick wall filter 52 to convert the signal back to the analog domain. This analog signal from filter 52 is applied to an analog-to-digital (A/D) converter 54 which runs at a different sample rate. (See FIG. 1) This analog approach is complex and presents signal degradation problems, due to harmonic distortion and noise caused by the A/D and D/A converters. Thus, sample rate converters are more commonly implemented using digital interpolation filters.

The operation of a digital interpolation filter, in both the time and frequency domains, will now be described in connection with FIGS. 2A–2C.

In FIG. 2A digital data samples 40 are shown as a sample data signal $x(N*T)$, sampled at a rate $Fs=1/T$. The Fourier transform of $x(N*T)$ is $X(w)$, which has periodic images 38 centered around all multiples of the sampling rate, as according to sampling theory.

A desired interpolation ratio (R) is chosen and, between each sample 40 of the original signal $x(N*T)$, (R–1) zero-valued samples 42 are inserted at constant intervals, as shown in FIG. 2B. This operation does not alter the frequency-domain description of the signal, except that the signal is considered to be sampled at a rate of $Fs\_new = R*Fs$.

The signal which included the zero-valued samples is applied to a digital low-pass filter, with a cutoff frequency of one-half the input sample rate, as shown in FIG. 2c. The output of this filter is the desired interpolated signal, with images 44 around the higher sampling rate of $Fs\_new$.

Referring now to FIG. 3, a purely digital sample rate converter includes a digital interpolation filter 60 placed between input and output samplers 62 and 64, as shown in FIG. 3. The filter 60 includes a zero-stuff circuit 68 and a lowpass filter 70. A zero-order hold 66 is used at the output of the interpolation filter 60, otherwise sample times would never line up and the output would be zero.

The purpose of the digital interpolation filter 60 between the two input and output samplers 62 and 64 in FIG. 3 is to produce a stream of output samples on a much finer time grid than the original input samples. When these interpolated values are fed into the zero-order hold 66, then asynchronously re-sampled by the output sampler 64, the output values represent the "nearest" (in time) values produced by the interpolation filter. There is always some error in the output samples due to the fact that the output sampler 64 does not operate to request a sample at a time that exactly corresponds to a point on the fine time grid of the interpolated outputs. This error is inversely related to the interpolation ratio (R).

FIG. 4 shows a purely conceptual hardware implementation of a digital interpolation filter, referred to because of its conceptual simplicity, but which requires too much hardware to be implemented in a practical manner. The input signal is sampled by sampler 80. A number of zero-valued samples are inserted at constant intervals (defined by the interpolation ratio and the input sample rate) between each sample by a zero-value sample insertion circuit 82, and applied to an FIR interpolation filter 84 which is shown as a classic convolution machine employing a shift register 86 in which the value stored in each tap 88 is multiplied using multiplier 92 by a corresponding coefficient value ($C_0$, $C_1$, ..., $C_n$). These products are summed by adder 94 to form an output. The asynchronous output re-sampling switch 96 grabs the "nearest" interpolated output when it closes. The fact that the interpolated output is held in a register 98 for the duration of one cycle of the interpolation clock is what provides a zero-order-hold function.

With such a circuit, if the interpolation ratio is about $2^{16}$ (i.e., 65536) and the input sampling rate is 50 KHz, the shift register must operate at a rate of 3.27 GHz. Providing a clock signal at such a rate is highly impractical. Moreover, assuming that the shift register needs to be operated at a rate of 3.27 GHz and that a new interpolated output is produced on every cycle, the estimated length of a reasonably good 20 kHz low-pass filter, (operating at a sampling rate of 3.27 GHz, having less than 0.01 dB of ripple and attenuating by more than 110 dB any frequencies above 24 kHz), is about 4,194,304 taps. This number represents both the length of the shift register and the number of filter coefficients which must be stored.

To develop a practical implementation of a digital sample rate converter using a digital interpolation filter requires reducing this conceptual hardware model described above into a practical hardware implementation. That is, the number of taps and coefficients and the operating clock frequency must be reduced. While others have found solutions to these problems, these solutions are problematic and/or limited. Most are not suitable for implementation in an integrated circuit.

For example, one problem experienced by all currently known systems is that the input and output sample rates are expected to be fixed. Thus, these systems are inflexible to changes in the input and output sampling rates. Further, when these rates are changed, so that the filter changes from an interpolation filter to a decimation filter, or vice-versa, these systems require different hardware configurations. For an example, see U.S. Pat. Nos. 4,604,720 and 4,584,659, issued to Eduard Stikvoort and assigned to U.S. Philips Corporation. Changes in input or output sampling rates thus require user interaction to modify the sample rate converter, or even a different circuit, which is generally undesirable.

Solutions to the reduction of the conceptual hardware model of FIG. 4 are based on the fact that the number of non-zero data values that exist at any one time in the shift register 86 is equal to the number of taps divided by the interpolation ratio R. For the example given above, the number of non-zero values is 64. Thus, there is no reason to compute every interpolated output at the 3.27 GHz rate when only roughly one out of 65,536 outputs is used. Further, since filter convolution only needs to be performed when an output sample is required, occurring at the output sample rate, the required multiply/accumulate rate is the product of the output sample rate and the number of non-zero input data values in the shift register at any one time.

This method implies that the exact arrival time of an output sample request is measured, and that this information is used to determine where the non-zero data values are in the conceptual shift register. Once the locations of these values are determined, the correct subset of filter coefficients can also be determined. These coefficients and data values are multiplied and summed together to obtain the desired result. Thus, the zero value data need not be stored in the shift register at all. As long as the correct data values are maintained in the shift register, and the correct coefficient subset to use is determined, the correct output for a given output sample request can be determined. Thus, the process can be considered as a time-varying FIR filter. Depending on the relative phases of the input sample clock and the output sample clock, a particular set of 64 coefficients out of the total coefficient space would be chosen to compute any requested output.

The problem with this method is that the arrival of an output sample request needs to be accurately measured in order to determine the position of the non-zero data values in the shift register with no error, thus implying that a high frequency clock is available, for example, running at 3.27 GHz, which was to be avoided in the first place. The only solution to this problem is to effectively average many more coarse measurements in a way that the DC error is guaranteed to go to zero over the long term.

Another problem with reducing the conceptual model involves reducing the set of filter coefficients that must be stored. Some solutions have been proposed to this problem, such as in U.S. Pat. No. 4,825,398, issued to Andreas Koch, et al., and assigned to Willi Studer, AG. Although the linear interpolation method shown may reduce a set of four million stored filter coefficients to about 16,000, that amount of storage is still problematic for an integrated circuit implementation of a digital sample rate converter. Higher order (e.g. quadratic) interpolation may enable further reduction of this set, but increases computational complexity.

Other systems involve using a number of fixed prefilters in combination with a smaller variable filter. One problem with these circuits is that they require the use of a high-frequency clock signal which is related to the input rate. Thus, a phase-locked loop must be used, requiring analog components, which is undesirable for a purely digital integrated circuit implementation.

A number of U.S. patents have been cited in this section for background purposes. The disclosures of these patents (U.S. Pat. Nos. 4,584,659, 4,604,720 and 4,825,398) are hereby expressly incorporated by reference.

SUMMARY OF THE INVENTION

A digital sample rate converter in accordance with the present invention includes a random access memory for storing input data values and a read only memory for storing a reduced set of interpolation filter coefficients. Input data is written to the random access memory at the input sample rate. Output samples are provided from a multiply/accumulate engine which, given a stream of input data and filter coefficients produces an output sample upon receipt of an output sample request. The initial address for reading input data from the random access memory and the address for reading the initial filter coefficient from the read only memory are provided by an auto-centering scheme. This scheme is a first-order closed-loop system with a digital integrator fed by an approximation of the input to output sample rate ratio. This auto-centering scheme may include a feed-forward low-pass filter to cancel steady state error, and an interpolated write address to reduce noise.

A circuit determining the output to input sample rate ratio can also be provided to scale coefficient addresses and resulting output samples to allow for the case when the output sample rate is less than the input sample rate. This circuit includes a form of digital hysteresis to eliminate noise.

The ROM coefficients are reduced by relying on the symmetry of the impulse response of the interpolation filter and by utilizing a variable step-size, forward and backward, linear interpolation.

The foregoing and other aspects, advantages, features and details of the present invention will be more fully understood in view of the detailed description which follows.

DETAILED DESCRIPTION

Figure 1:
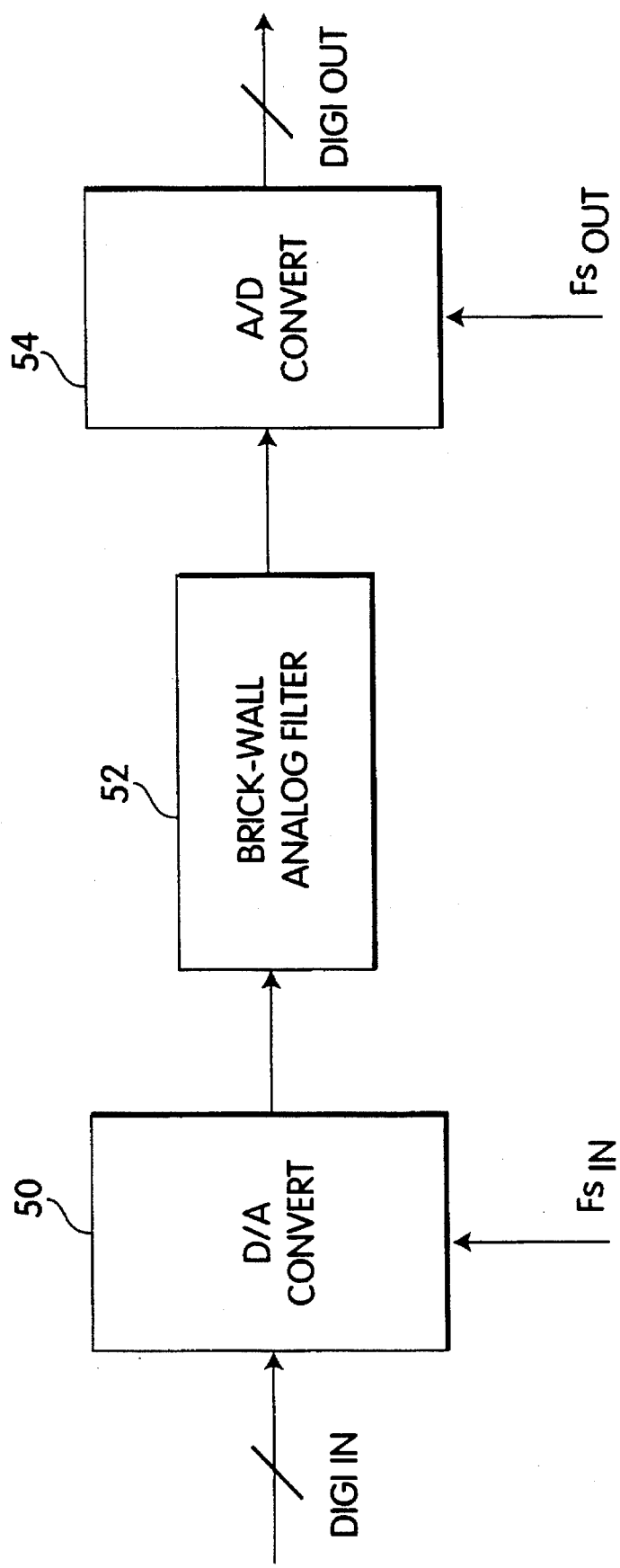
FIG. 1 is a block diagram of an analog method for sample rate conversion.
Figure 2A:
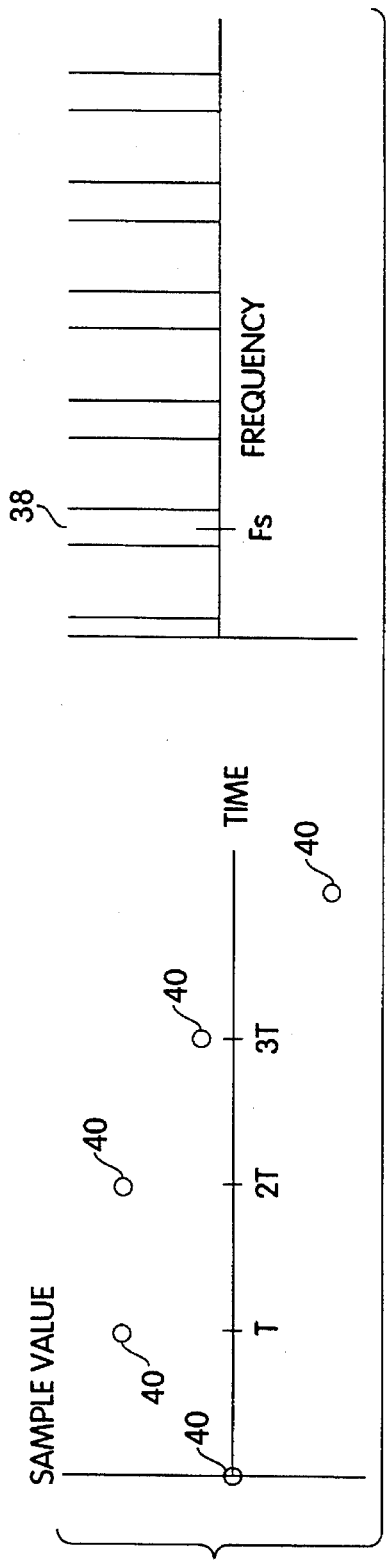
FIGS. 2A through 2C are graphs illustrating the concept of digital interpolation.
Figure 2B:
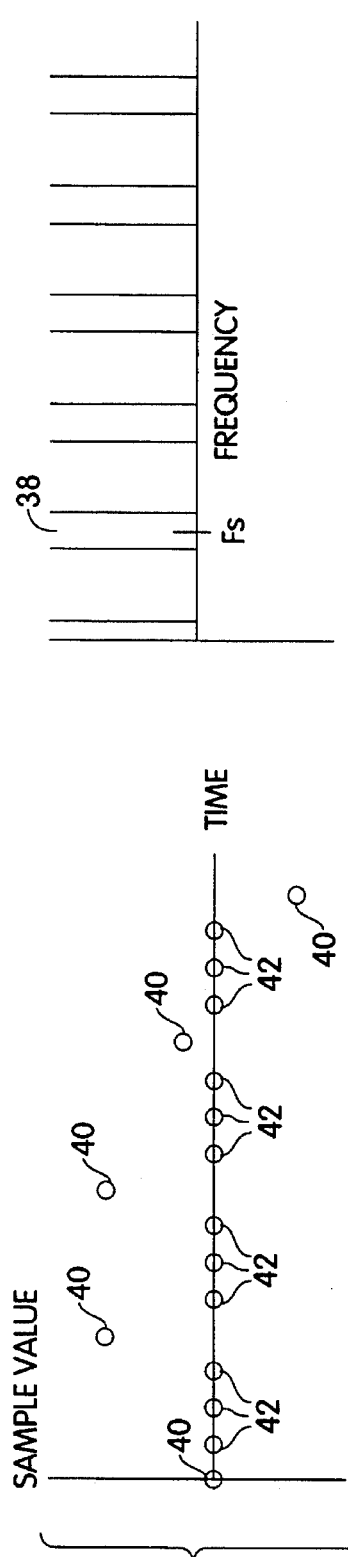
Figure 2C:
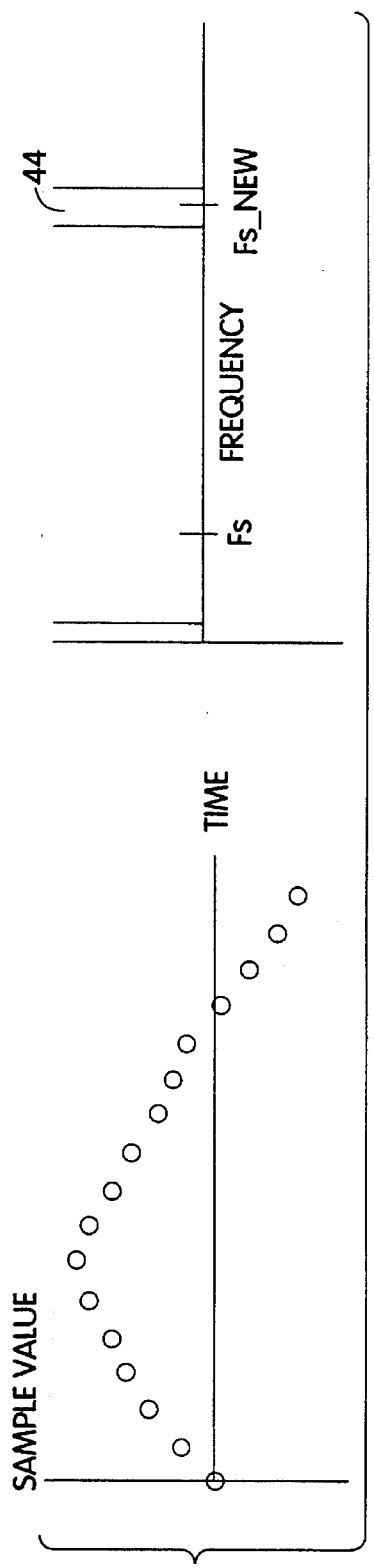
Figure 3:
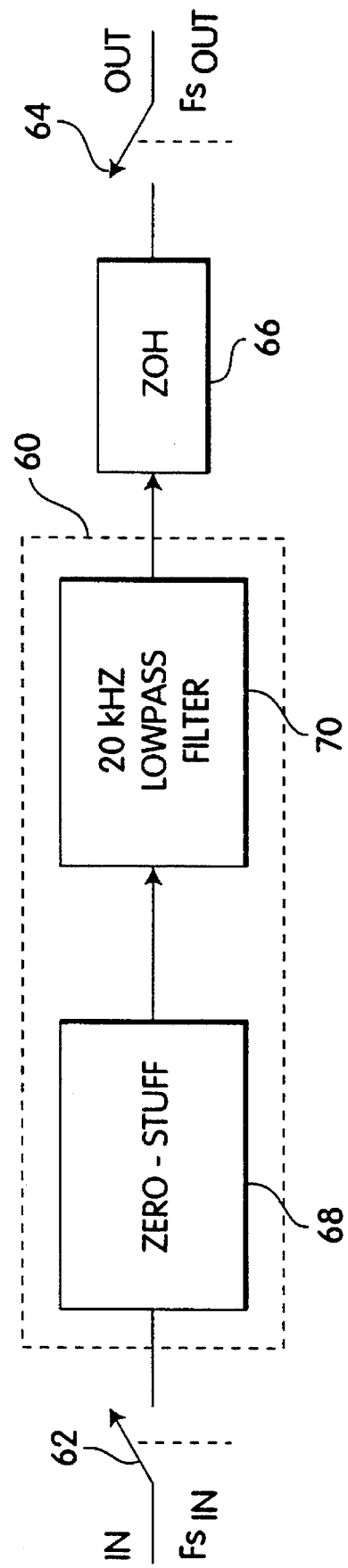
FIG. 3 is a block diagram describing how digital sample rate conversion is performed.

A detailed description of a preferred embodiment of the invention will now be provided. This embodiment has been developed for implementation as an integrated circuit for use with digital audio equipment, and has been optimized accordingly. It should be understood by those skilled in the art that modifications may be made to optimize the sample rate converter for different applications. The interpolation ratio, the set of stored filter coefficients, the size of a RAM for storing input data, the interpolation filter design, and the gain of auto-centering scheme, are factors among others which can be optimized for a given application.

As described above, in order to design a sample rate converter, appropriate digital interpolation filter coefficients are determined. In the preferred embodiment, an interpolation ratio of $2^{16}$ (i.e., 65,536) was selected. A conceptual description of such a filter, and the implementation problems to be solved, were provided above in connection with the description of FIG. 4.

The interpolation ratio is selected on the basis of an error criterion selected for the output. For the preferred embodiment a sample rate converter with 16-bit accuracy was desired, thus the difference between any two adjacent interpolated values should be less than one least-significant-bit (1 sb) at the 16-bit level.

The interpolation ratio required to achieve 16-bit accuracy is determined on the basis of the input signal that causes the worst-case sample-to-sample difference in the interpolated output. Since the interpolation filter ideally cuts off at 20 kHz (the brick wall filter cut-off frequency), the maximum slew rate of a 20 kHz sine wave may be assumed to be the worst case signal. If maximum output levels of +/−1 are assumed, then a 20 kHz sine wave has a peak slew rate (S.R.) of:

$$S.R.=2*PI*1*20 \text{ kHz}=125,600 \text{ v/sec.}$$

A time grid of interpolated output signals is desired, such that when multiplied by the slew rate above results in an error of less than $2/(2^{16})$, which is one 16-bit 1 sb of the +/−1 range assumed above. This time grid is easily found to be 240 ps. If the input sample rate is assumed to be about 50 kHz, the corresponding interpolation ratio R is 83,333.

Actually, a ratio of 83,333 is quite conservative for several reasons. First, the RMS error over a 20 kHz sine-wave is more meaningful than the peak error and results in a requirement for an interpolation ratio that is about 3 dB lower than the peak error-based analysis would suggest. Moreover, the error introduced by the misalignment of the output sampler with the interpolation time grid was assumed to be maximum at each output sampling time, when it is actually a statistical distribution that will tend to lower the RMS error. For these reasons, for this embodiment an interpolation value of $2^{16}$ (65,536) was used to achieve 16-bit accuracy. Accuracy at lower frequencies and/or levels is significantly higher due to the sin(x)/x nature of the zero-order hold (ZOH) frequency response.

Given the desired interpolation ratio, a problem solved by the present invention is the determination of the correct set of filter coefficients, to be multiplied with input data, based on the relationship of input data to locations in a conceptual shift register. The solution to this problem in the preferred embodiment also solves the problem of making the system respond adequately to step changes in sample rates.

Figure 5:
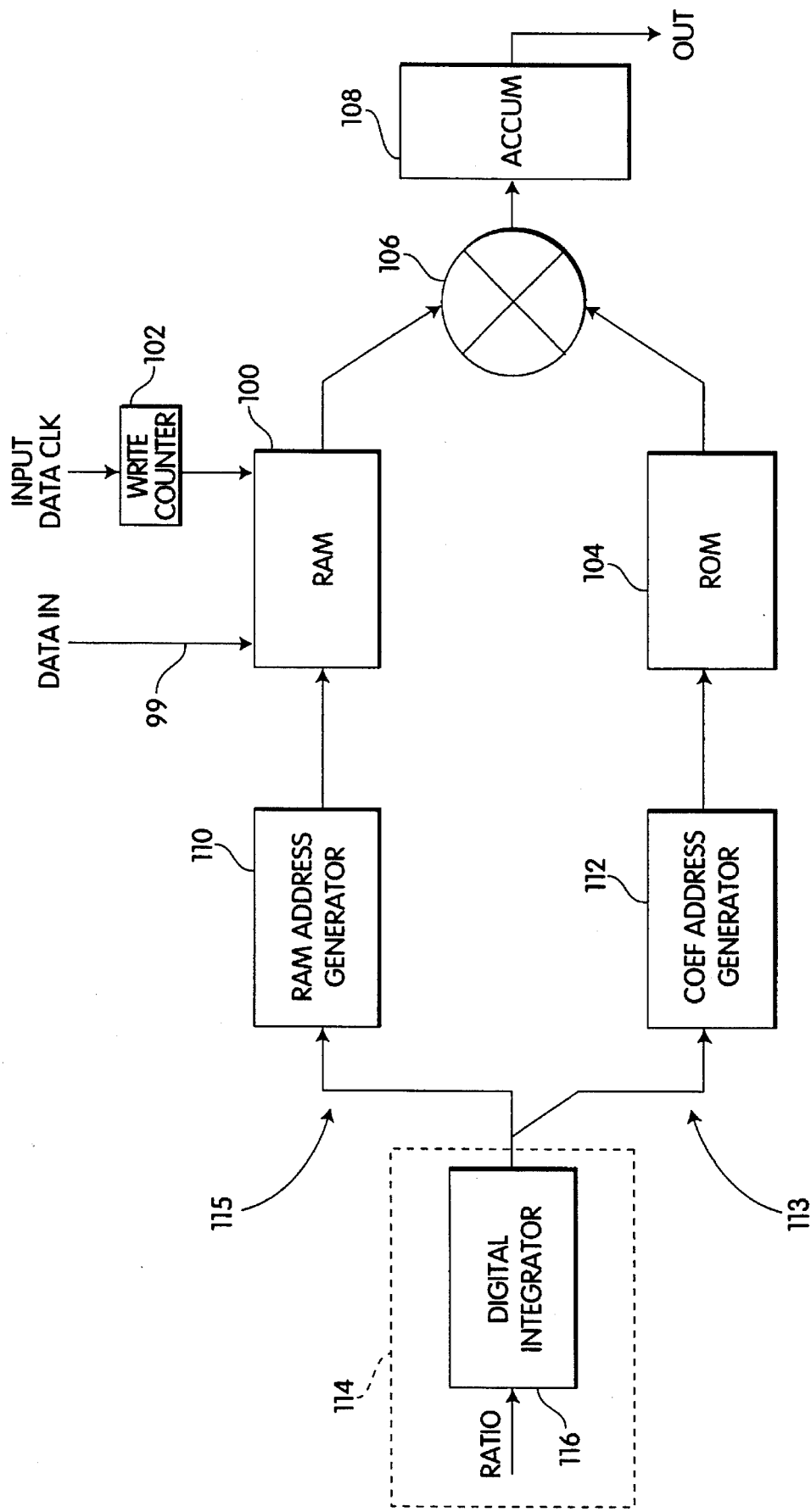
FIG. 5 is a block diagram of a sample rate converter in accordance with the present invention.

FIG. 5 is a block diagram of an embodiment of the invention. In place of a shift register, a random access memory (RAM) 100 is used to store incoming data samples. The RAM 100 is addressed for writing data by a write counter 102 which is incremented according to the input sample rate. RAM 100 is also addressed for reading data by a RAM address generator 110 which generates read addresses.

Input data received via line 99 is written to sequential locations in the RAM 100, according to the write address in write counter 102. When the limit of the write addresses (due to the memory size) is reached, writing continues at the first location in the RAM.

In response to an output sample request (not shown), a RAM address generator 110 and a coefficient address generator 112 are controlled to access sequentially a subset of the input data values in the RAM 100. The accessed data values are multiplied (by multiplier 106) by corresponding filter coefficients stored in a read only memory (ROM) 104, and accumulated (by accumulator 108) to provide an output. The RAM address generator 110, given an initial input data location in the RAM 100, accesses sequential addresses to obtain the input data. The coefficient address generator 112, given the location of the first filter coefficient and an increment value, which is typically the interpolation ratio, generates the locations of coefficients corresponding to the accessed input data values. The increment value changes and the first coefficient address is scaled for a decimation filter (when the output sample rate is less than the input sample rate), as will be explained in more detail below.

Figure 4:
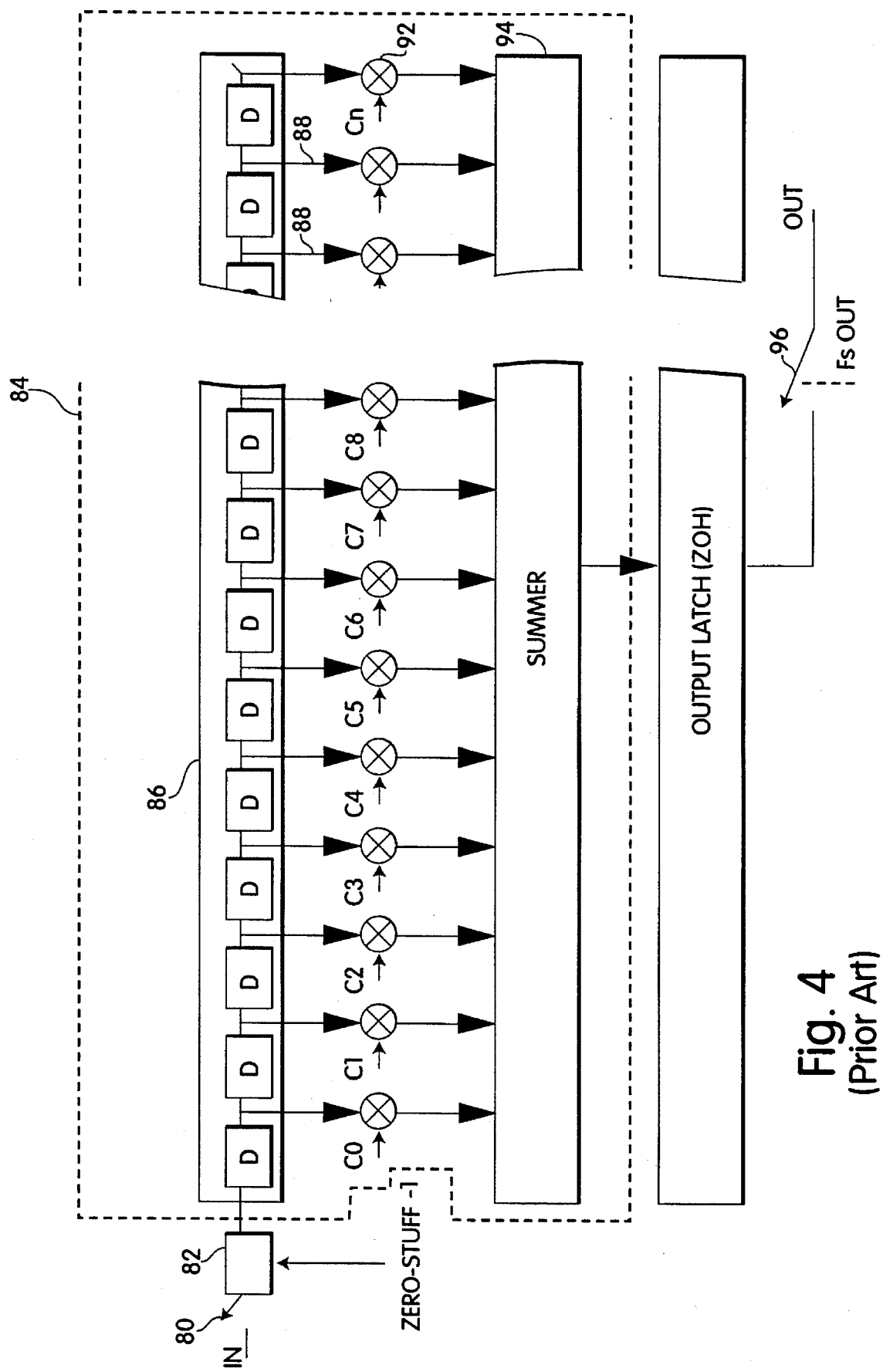
FIG. 4 is a conceptual block diagram of a theoretical digital sample rate converter.

The coefficient addresses generated by generator 112 indicate locations corresponding to the conceptual shift register model of the filter (FIG. 4). However, not all of the corresponding coefficient values are actually stored. An interpolation is performed on a reduced set of coefficients, using the input coefficient addresses. This interpolation procedure is discussed in more detail below in connection with FIGS. 14 through 19.

The address of the first data value in the RAM 100 (the read start address), and the first coefficient in the ROM 104 are generated by a ramp generating circuit 114 which generates a ramp signal using a digital integrator 116 fed with a signal approximating the ratio of the input sample rate to the output sample rate. The digital integrator 116 provides new values according to the output sample rate. Thus, its average slope is proportional to the input sample rate. The output is split: a lower-order set of bits (fractional part) is transmitted to line 113 to provide the first filter coefficient address; an upper-order set of bits (integer part) is transmitted to line 115 to provide the address of the initial input data value (the read start address) in the RAM 100.

A reason for using an integrator to generate both the read start address to RAM address generator 110 and the first coefficient address for the coefficient address generator 112, and a circuit implementing this feature, will now be described in connection with FIGS. 6–13.

Figure 6:
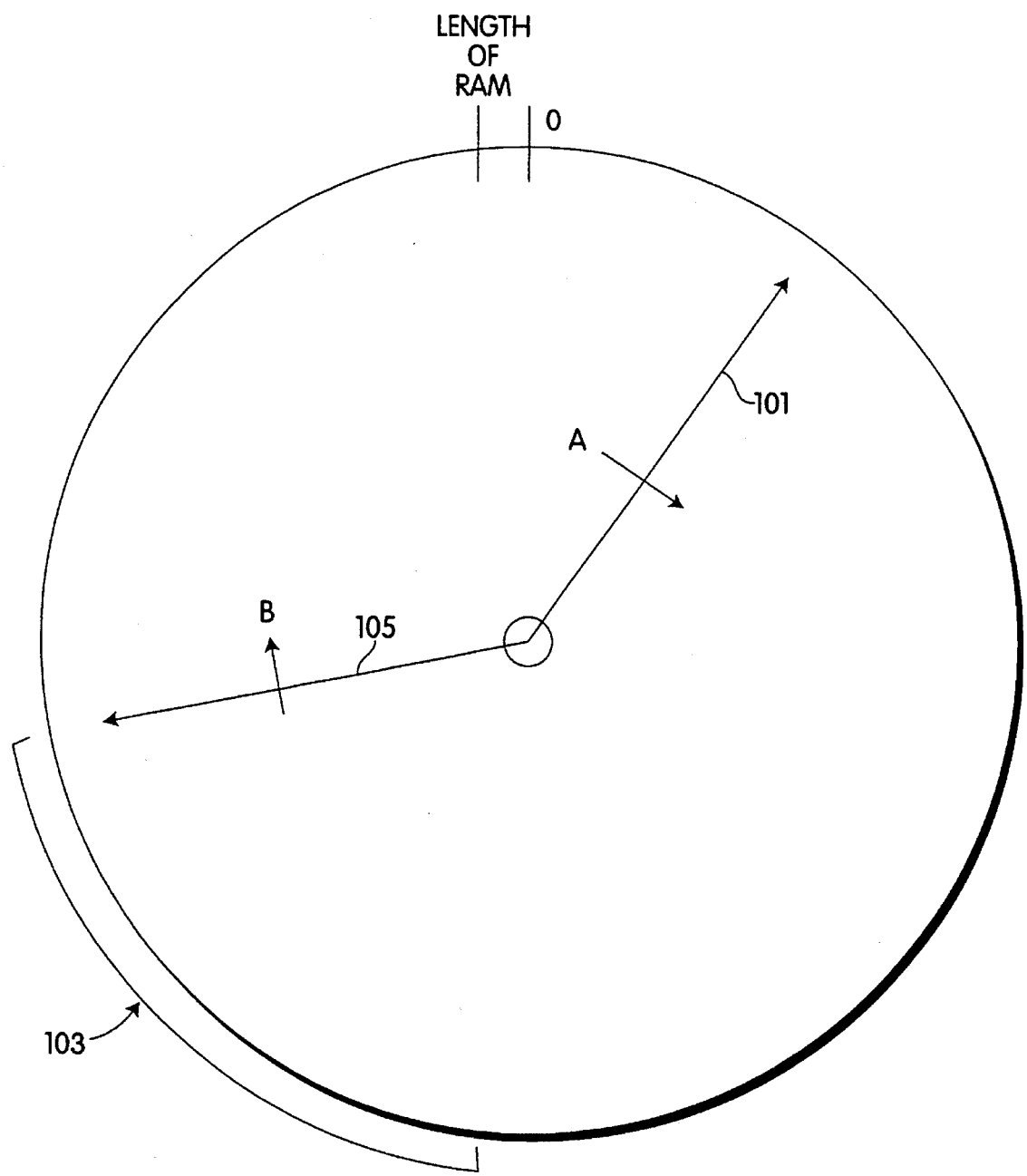
FIG. 6 is a conceptual diagram illustrating read and write addresses of input data in a random access memory.

Since data cannot be easily shifted into or within a RAM, with new data inserted at RAM address 0, the read and write addresses are considered as pointers in a circular (modulo) RAM. FIG. 6 shows a conceptual diagram. Each time an input sample request occurs, the write address pointer 101 is incremented (rotating in direction A) and the input data is written to the location indicated by the new write address pointer value. When the end of memory is reached (i.e., when pointer 101 reaches "LENGTH OF RAM"), the write address pointer wraps to zero.

As with a shift register, there is no need to store all the zero-valued samples (resulting from the zero-stuffing operation) in RAM, as they contribute nothing to the accumulated sum. The RAM length must be large enough so that all past non-zero values needed for the filter fit in the RAM without wrap-around. Preferably, some overhead is provided to absorb step changes in sample rates. The selection of the overhead size will be described in more detail below.

In the shift register model of the filter, each coefficient multiplied the value of one location in the shift register array. In a RAM-based architecture, the data segment 103 (FIG. 6) to be multiplied by a coefficient array is constantly rotating around the circular RAM in direction B. Therefore, a rotating read pointer 105 gives the address of the first data value to be multiplied by the first coefficient of the filter. This value does not have to be the most recently written input value. Some delay is desirable to make the RAM an elastic store buffer, to allow the converter to respond to step changes in input or output sample rates.

If an infinitely accurate number representing the ratio of the input sample rate to the output sample rate were available computation of the read start address would be simple. As discussed above, an integrator fed this ratio and sampled at the output sampling rate has an average slope equal to the input sample rate. This slope is the same as the slope of the write address. However, if the ratio is incorrect, the average slope of the read start address from the integrator 116 is different from the average slope of the write address. Thus the offset of the read start address from the write address changes, and they may eventually cross, resulting in errors. The error between the average slopes of the read and write addresses can be used to correct the ratio estimate and thus to correct the output of the digital integrator. Therefore, the read start address is determined from an estimate of that ratio which has no error when averaged over a long term. This estimate is determined using an auto-centering circuit described below in connection with the description of FIGS. 8–13.

Figure 7:
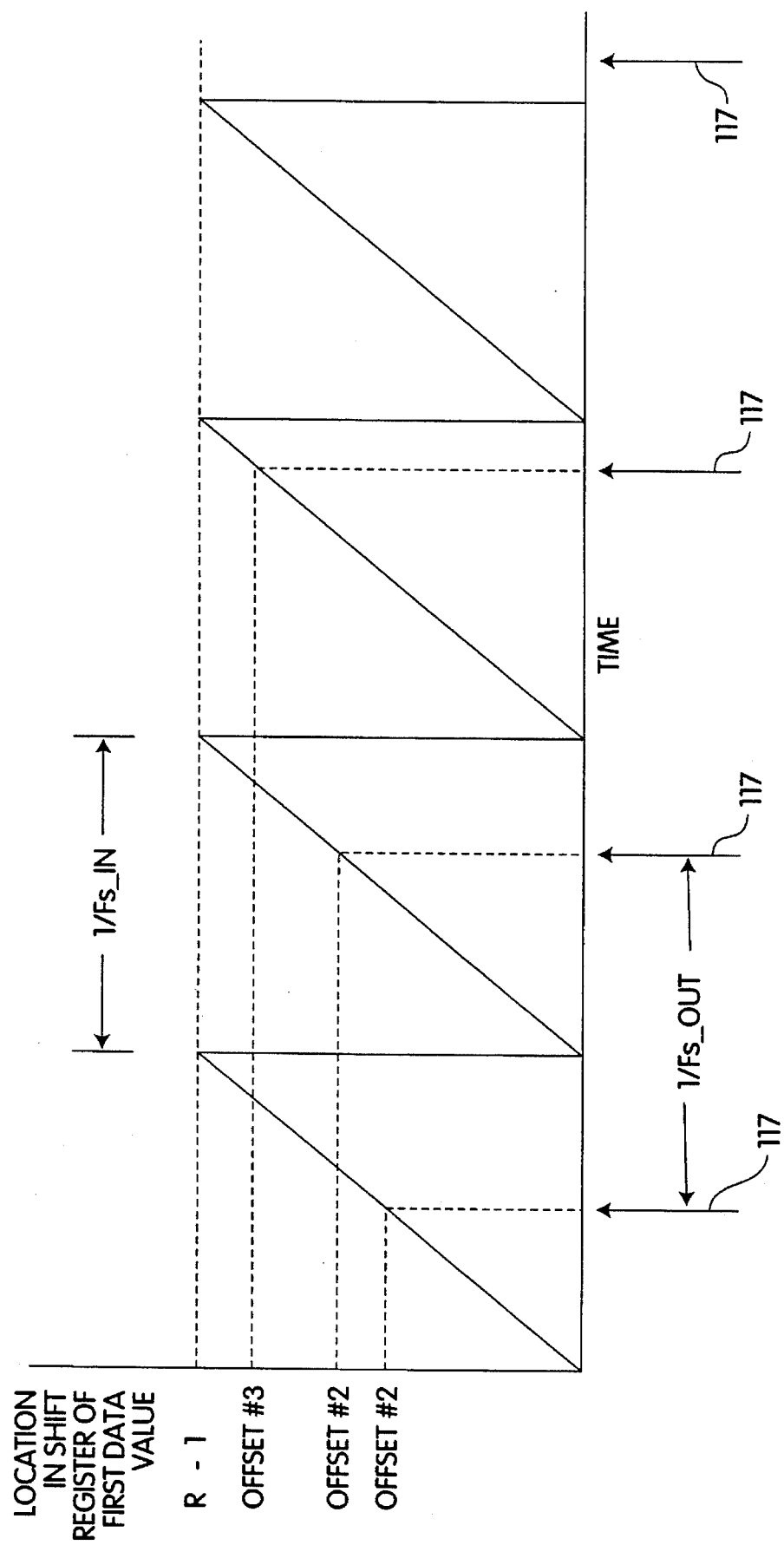
FIG. 7 is a conceptual diagram illustrating how the location of the first data value in the shift register changes with respect to time.

The location of the first non-zero data value in the shift register of the conceptual model, and thus the first coefficient address, also changes in a manner similar to the read start address for the RAM. FIG. 7 is a timing diagram of the location in the conceptual shift register of the first non-zero data value with respect to time. Arrows 117 along the time axis show when an output sample clock edge occurs. Since new data enters the conceptual shift register periodically, according to the selected interpolation ratio (R), the location of the first non-zero data value linearly increases to (R)-1 and then goes to zero when new data enters. Therefore, given an input sample rate (Fs_in) and an output sample rate (Fs_out), the following equation may be used to compute recursively a new coefficient offset number from the last, or "old", offset number:

$$\text{New offset} = (\text{old offset} + (R) * Fs\_in/Fs\_out) \bmod (R).$$

To gain some intuitive insight into this equation, if the input and output sample rates are exactly the same, the same coefficient offset number is produced for each output clock, as (R) is added to the old offset and the result is taken modulo (R). Referring to the shift register model of FIG. 4, if the input and output sample rates are identical, the location of the first non-zero data value in the shift register remains the same for each closing of the output sampling. If, however, the input sampling rate is slightly greater than the output sampling rate, the location of the first non-zero data in the shift register drifts slowly to the right for subsequent closings of the output sampling switch, until this location "wraps" back through zero. Conversely, if the input sampling rate is slightly lower than the output sampling rate, the location of the first non-zero data value in the shift register slowly drifts to the left until it wraps.

Because the first coefficient address ramps from zero to the interpolation ratio R, with a frequency of the input sample rate, and because the read start address increments according to the input sample rate, the first coefficient address is simply the fractional part of the read start address. Thus, a lower-order set of bits (a fractional part) of a ramp signal (which ramps from zero to the length of the RAM 100, less one, and which increments according to the input sample rate) indicates the first coefficient address while an upper-order set of bits (an integer part) indicates the read start address. The number of bits of the fractional part is typically the number of bits used to represent the value of the interpolation ratio R, less one, as a binary number. The number of bits of the integer part is the number of bits which are needed to access all addresses of the RAM 100.

A preferred embodiment for a ramp generating circuit 114 will now be described in connection with FIG. 8. This embodiment is a first-order closed-loop system which determines, from user-supplied clocks, a digital estimate of the ratio of the input sample rate to the output sample rate, where the ratio is unknown. This estimated ratio is fed to an integrator to provide the desired ramp signal for the read start address and the first coefficient address. It also maintains the average difference between read and write addresses at a desired offset. The effective cutoff frequency of this first-order loop is preferably 4 to 15 Hz.

The integrator 116 provides the desired ramp signal. Since the digital integrator 116 receives an input proportional to the ratio of the input sample rate to the output sample rate, and is sampled at the output sample rate, the "average slope" of the integrator output is equal to the input sample rate. Therefore, the integrator 116 output can be subtracted from the write address to obtain a difference whose average value should be constant over time if the ratio applied to integrator 116 agrees with the actual input and output sample rates. Therefore, the output of integrator 116 is fed back to subtractor 118 which subtracts it from the current write address latched by latch 111 at the output sample rate from write address counter 102.

This output of subtractor 118 is applied through a small loop gain 124 (K) to adder 126 which adds a "one" so that the nominal slope of the output of integrator 116 is equal to the nominal slope of the write address when the input and output sample rates are equal. For a fast settling time (e.g. 200 ms when the output sample rate is 50 kHz), a gain of 1/512 may be used. For a relatively slower settling time (e.g. 800 ms when the output sample rate is 50 kHz), a gain of 1/2048 may be used.

The subtractor 118 is designed to take the correct modulo difference between two digital signals which are linearly increasing and which periodically wrap to zero. Subtractor 118 is a 2's complement subtractor operating in the following manner. The two inputs, which are positive-only digital signals, are each appended with a zero-value sign bit and applied to the inputs of the subtractor. Assuming that each input signal is comprised of N-bits; when the most significant bit, (sign bit) of the subtractor output is truncated, and the new most significant bit after truncation is treated as the sign bit, the result is an N-bit 2's-complement number. This method gives the correct result as long as the modulo difference of the two positive numbers does not exceed $\pm 2^{N/2}$.

A potential problem with this scheme is an inversion of the feedback polarity when the difference exceeds $\pm 2^{N/2}$, which typically occurs after a step change in sample rates. The problem is analogous to the phase-detection problem of phase-locked loops, where "cycle-slipping" causes an inversion of feedback polarity when the loop is unlocked. With this circuit, system stability is maintained by using a first-order control loop, because it has no "momentum". If a second-order loop were used, an inversion in feedback polarity would cause permanent instability to occur.

A problem with the first-order control loop is that it has a DC error in the presence of a ramp input. This DC error is undesirable because it changes in response to changes in the input and output sample rates, thus causing the separation between read and write addresses to change. Such a problem is normally solved using a second order control loop. However, because a second-order control loop may become permanently instable in response to changes in sample rates, second-order control should not be used. Thus, in this invention a feed-forward error cancellation scheme is used to cancel the steady-state DC error without introducing another integrator in the control loop. The feed-forward cancellation scheme involves taking the loop error output of subtractor 118, filtering it using a low-pass filter 120, and subtracting this filtered loop error from the output with a subtractor 122. Such a first-order control loop with feed forward cancellation settles after a step change both to the correct slope and to zero offset.

Figure 8:
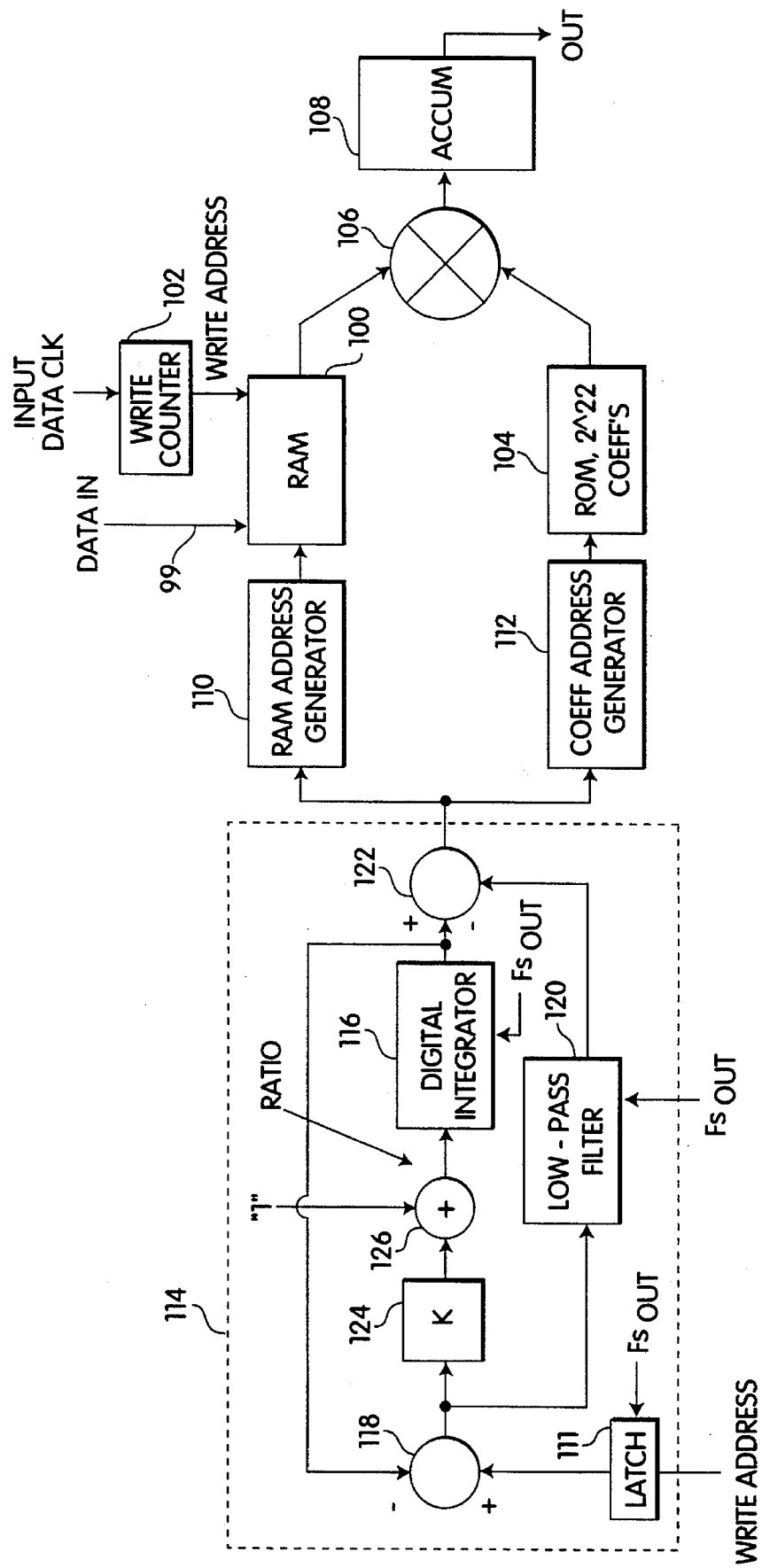
FIG. 8 is a block diagram of a preferred embodiment of the invention illustrating a ramp generating circuit.

Although the circuit of FIG. 8 provides an adequate signal, there is a potential for excessive amounts of noise on the integrator output, causing the integrator output to deviate from an ideal ramp signal, thus causing a variation in the selection of the filter coefficients. The reason for this noise is the following. The output of the write address counter is sampled by a latch 111 at the output sample rate. Therefore, the write counter is "sampled" at a rate that is different from the rate at which it is counting. Thus, the write counter may occasionally advance by 2 (if the input sample rate is greater than the output sample rate) or 0 (if the input sample rate is less than the output sample rate), instead of always advancing by 1. Thus, the write address signal provided to subtractor 118 by latch 111 has a large noise-like component.

While this noise is filtered by the first-order nature of the auto-centering loop, it is preferable to reduce it further. Although the loop cutoff frequency could be made very low (e.g., less than 1 Hz), the settling time for such a filter in response to a step change would be very large. Even worse, certain ratios of output to input sample rates cause error "patterns" that have very low frequency components, resulting in most of the error energy being below the cut-off frequency of the loop.

Instead of modifying the cut-off frequency of the auto-centering loop, the latched write address is interpolated. This interpolation can be performed by using a "fractional" part of the write address, determined by counting the number of master clock cycles between an input sample request and the immediately subsequent output sample request, and then dividing this number by the number of master clock cycles between the last two input sample requests. This quotient may be concatenated with the latched value from the write address counter 102 to interpolate the write address. By using the highest frequency master clock signal available to the system (16 MHz in the preferred embodiment), a fine time resolution (30 ns) is possible (by using both edges of the master clock signal), resulting in a latched write address of higher accuracy. The integer part of the write address from the write address counter is still used as the write pointer to RAM 100 while the latched interpolated address is used by the auto-centering loop.

Figure 9:
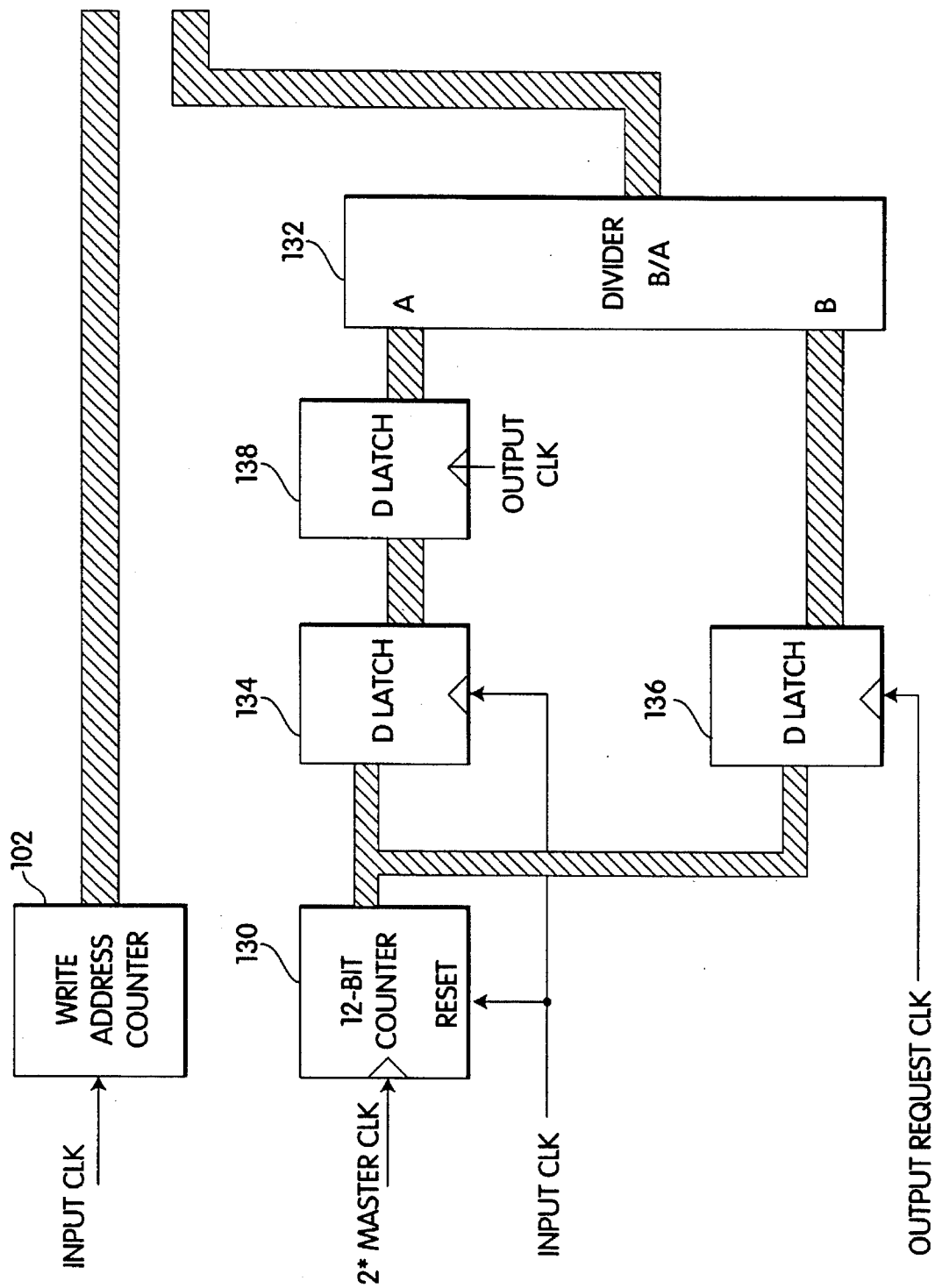
FIG. 9 is a block diagram of a circuit for interpolating the write addresses.

FIG. 9 is a block diagram of a circuit for interpolating the write address fed to the subtractor 118 (FIG. 8). The write address counter 102 is used to provide an integer part of the write address. A fractional part of the write address is provided from a divider 132. The fractional part of the write address is obtained by having a high speed master clock (e.g., 16 MHz) driving a counter 130. The counter 130 is reset upon the arrival of an input sample request which also latches the output of the counter 130 using latch 134. Upon receiving an output sample request, the output of counter 130 is latched by latch 136, and the contents of latch 134 are latched by latch 138. The contents of latch 138 represents the number of master clock cycles between the last two input sample requests. The contents of latch 136 represents the number of master clock cycles between the most recent input sample request and the most recent output sample request. This value is divided by divider 132 to obtain a fractional part of the write address.

Figure 27A:
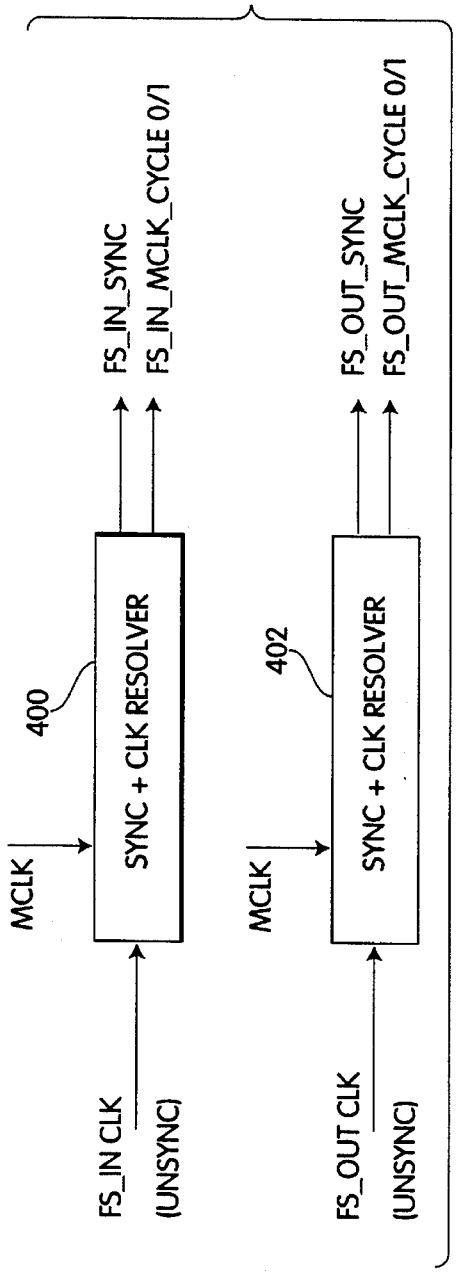
FIGS. 27A and 27B is a block diagram of a preferred embodiment of the circuit of FIG. 9.

In the preferred embodiment of this circuit, shown in FIG. 27, a master clock at 16 MHz drives an 11-bit counter because it is difficult to get accurate timing and synchronization with a 12-bit counter running at 32 MHz. Further, in order not to force a user to provide a 32 MHz master clock, a circuit, providing the same resolution as a 12-bit counter running at 32 MHz, was designed to run at 16 MHz. The first part of that circuit, shown in FIG. 27A, are synchronizers and clock resolvers 400 and 402 which respectively synchronize the input and output sample requests (FS_in_clk and FS_out_clk) to the master clock. The resulting outputs from resolvers 400 and 402 are FS_in_sync and FS_out_sync. Resolvers 400 and 402 also provide a signal which indicates which half of the master clock cycle the input or output sample request occurred. The output is a logical low value if the request occurs from the first half. Thus, the second output of resolvers 400 and 402 respectively is FS_in_mclk_cycle and FS_out_mclk_cycle.

Figure 27B:
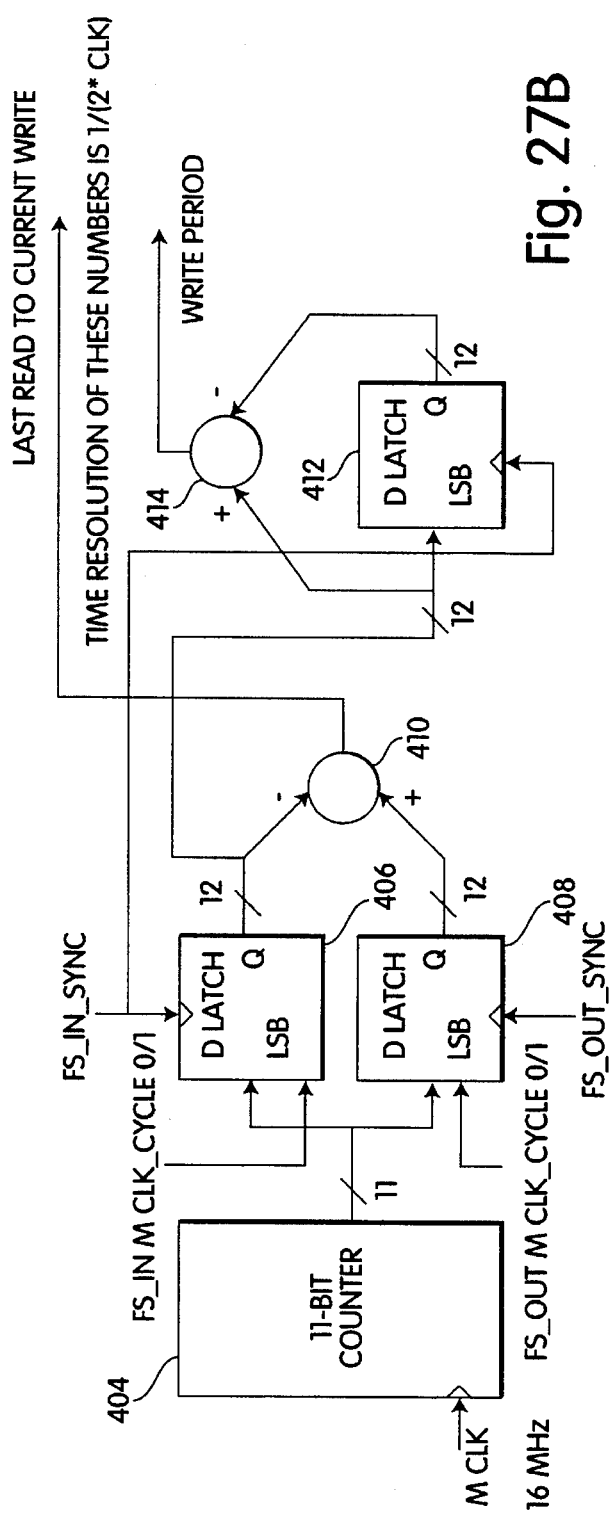

In FIG. 27B, the 11-bit counter 404 is driven by the master clock running at 16 MHz. It is allowed simply to wrap; it is not reset. The output from the counter 404 is fed to two latches 406 and 408. Latch 406 receives the FS_in_mlck_cycle as its least significant bit (LSB) and is latched by the FS_in_sync signal. Similarly, latch 408 receives as its least significant bit the FS_out_mclk_cycle and is clocked by the FS_out_sync signal from resolver 402. The outputs of latches 406 and 408 are fed to a subtractor 410 which determines the difference of those outputs. That difference provides the number of master clock cycles from the last read to the most current write request, and is fed to the B input of divider 132 (FIG. 9). The output of latch 406 is also fed to another latch 412 which is latched by the FS_in_sync value. The input and the output of latch 412 are subtracted by subtractor 414 to provide an indication of the number of master clock cycles between two input sample requests. This value is fed to the A input of divider 132 in FIG. 9.

With the circuit of FIG. 9 or of FIG. 27A–B, interpolation of the write address is performed to a time resolution of 30 ns. It was found by simulation that the effective time-base jitter may be reduced to the point where full-level 20 kHz signals are reproduced with greater than 16-bit quality.

As discussed above, some extra space should be provided in the RAM, as this auto-centering loop responds relatively slowly to step changes in the input or output sample rate. The extra RAM space insures that the write and read addresses do not "cross" before the auto-centering loop settles after a step change. The appropriate RAM size is dependent upon the amount of extra RAM required when a step in input or output sample rate occurs.

Also, an offset is added to the read start address so that it is not equal to the current write address. The offset is added in the RAM address generator 110, described below. The selection of the offset between the read and write pointers is dependent on the application. Where large step changes in input or output sample rate are expected, the section of RAM used for reading out all data should ideally be centered as far away as possible from the current write location in RAM. In many instances, no large steps in sample rate are expected, and only a small offset (e.g., about 1) is required. This may also be desirable from the point of view of minimizing the group delay of the input signal. For example, if the output sample rate is suddenly increased, the read start address catches up with the write address and may cross it if the ramp generating circuit 114 does not respond quickly enough. From results of simulation of the preferred embodiment described above, it was determined that a RAM size of 256 locations per channel is adequate to absorb most sample-rate step changes encountered in practice while preventing read and write addresses from crossing during the settling time of the auto-centering loop.

An advantage of this new circuit is that the measurement of input to output sample rate ratio is done over many hundreds or thousands of input cycles, thereby eliminating the need for a multi-GHZ clock to make instantaneous measurements.

Another advantage of the highly filtered version of the estimate of the input to output sample rate ratio provided by this circuit is that jitter, present on either the input clock or the output clock, does not greatly affect this estimate. Thus, the estimate of where the non-zero data values are in the conceptual shift register is not affected by clock jitter, and therefore the data at the sample rate-converted output also is not affected by clock jitter. This same advantage does not apply to systems that use a high-frequency clock based on the input clock to make instantaneous clock-edge arrival time measurements.

Although there is the potential for audible Doppler shifts when the input or output rates are changed suddenly, if the sample rate changes are restricted to be slower than the settling time of the auto-centering loop, no Doppler shift will be audible.

Figure 10:
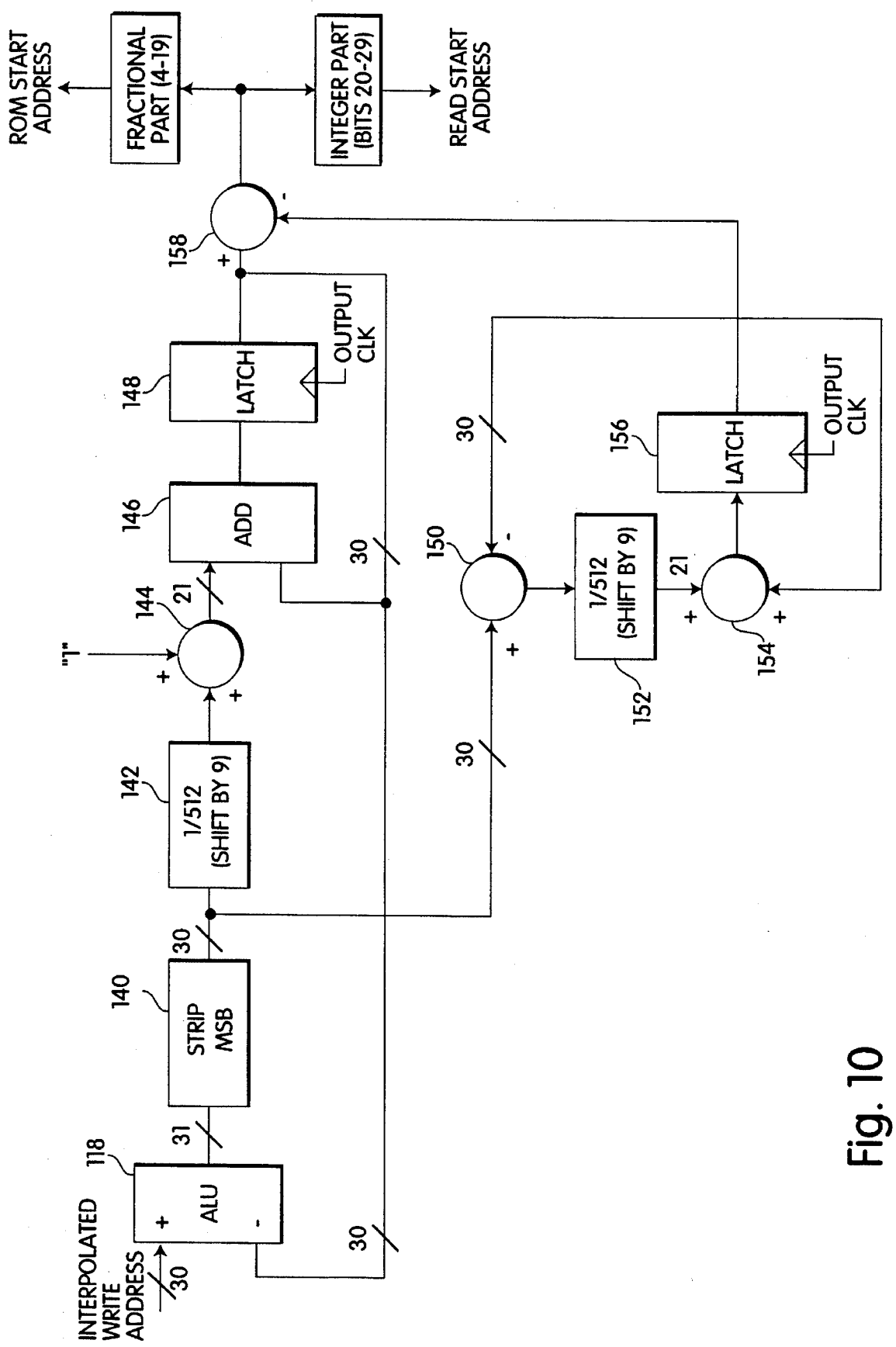
FIG. 10 is a block diagram of a preferred embodiment of the ramp generating circuit.

FIG. 10 is a block diagram of a preferred implementation of the auto-centering scheme illustrated in FIG. 8. In this embodiment, the interpolated write address is 30 bits, where the lower 20 bits are the fractional part and the upper 10 bits are the integer part from the write counter 102. Only 8 bits of the upper 10 bits are used to provide a write address to the RAM 100. The extra 2 bits are used as an input to the auto-centering scheme so that subtractor 118 does not wrap even when a step change in sample rates occurs.

This interpolated write address is applied to subtractor 118. The most significant bit (MSB) of the output of subtractor 118 is stripped (by circuit 140) and then the result is shifted by 9 bits (divided by 512) in a shift register 142. A one is added by adder 144. The output of adder 144 is applied to another adder 146 which adds it to any previous output of the adder 146. A latch 148 latches the output of the adder 146 in response to an output sample request. The output of latch 148 is fed back to adder 146 and to the subtractor 118.

The output of circuit 140 is also fed to a feed-forward cancellation circuit (low-pass filter 120 of FIG. 8). The low-pass filter includes a subtractor 150 which subtracts the output of the low-pass filter from the output of circuit 140. The output of subtractor 150 is then shifted by 9 places, to divide by 512, by shift register 152. The output of the shift register 152 is added by adder 154 to the output of the filter. The output of this adder is latched by latch 156, to provide the output of the filter.

The output of the feed forward low-pass filter 120 is subtracted from the output of the latch 148 by a subtractor 158 to provide the output of the ramp generating circuit 114. As mentioned above, the fractional part (lower bits) of that output provides the starting addresses for the filter coefficient, and the integer part (upper bits) provides the read start address.

Adaption for Decimation

In the above discussion, the output sample rate was considered to be higher than the input sample rate. When the output sample rate is less than the input sample rate, the filter characteristic must dynamically change to reduce the cutoff frequency, in order to avoid aliasing. A property of Fourier transforms provides a basis for implementing such dynamic changes.

If a signal is linearly contracted in the time domain, its spectrum is linearly expanded in the frequency domain. Normally this theorem would not apply to discrete-time systems, because the new time steps that result in time-expanded or contracted samples after stretching or contraction no longer are aligned with the original time grid corresponding to the input sampling rate. For example, if a signal were sampled at 1 MHz and the time variable were multiplied by 10%, the signal at time t=2 µs should ideally come out at 2.2 µs; But, if the time grid is constrained to 1 µs, this sample value would have to come out at 2 µs instead. This difference would ordinarily cause severe spectral distortion.

With the preferred embodiment of the invention, the time grid of the lowpass filter coefficients is so dense compared with the cutoff frequency (0.3 ns for a 20 kHz cutoff frequency) that the error introduced by rounding a contracted or expanded coefficient to the nearest 0.3 ns is negligible. Thus, the cutoff frequency of the low-pass filter (of the digital interpolation filter) can be changed by scaling the first coefficient address and the increment value used to step through the filter coefficients stored in ROM 104 while doing the multiply/accumulate operations.

When the input sample rate (Fs_in) is less than the output sample rate (Fs_out), the increment or step value used to access successive filter coefficients from the ROM is normally the interpolation ratio R. When the input sample rate is greater than the output sample rate, however, the increment value follows the formula (R)*(Fs_out/Fs in). Additionally, the first coefficient address is multiplied by the output to input sample rate ratio. By scaling the first coefficient address and increment value by the output to input sample rate ratio all address references to the ROM are correctly scaled.

Figure 11:
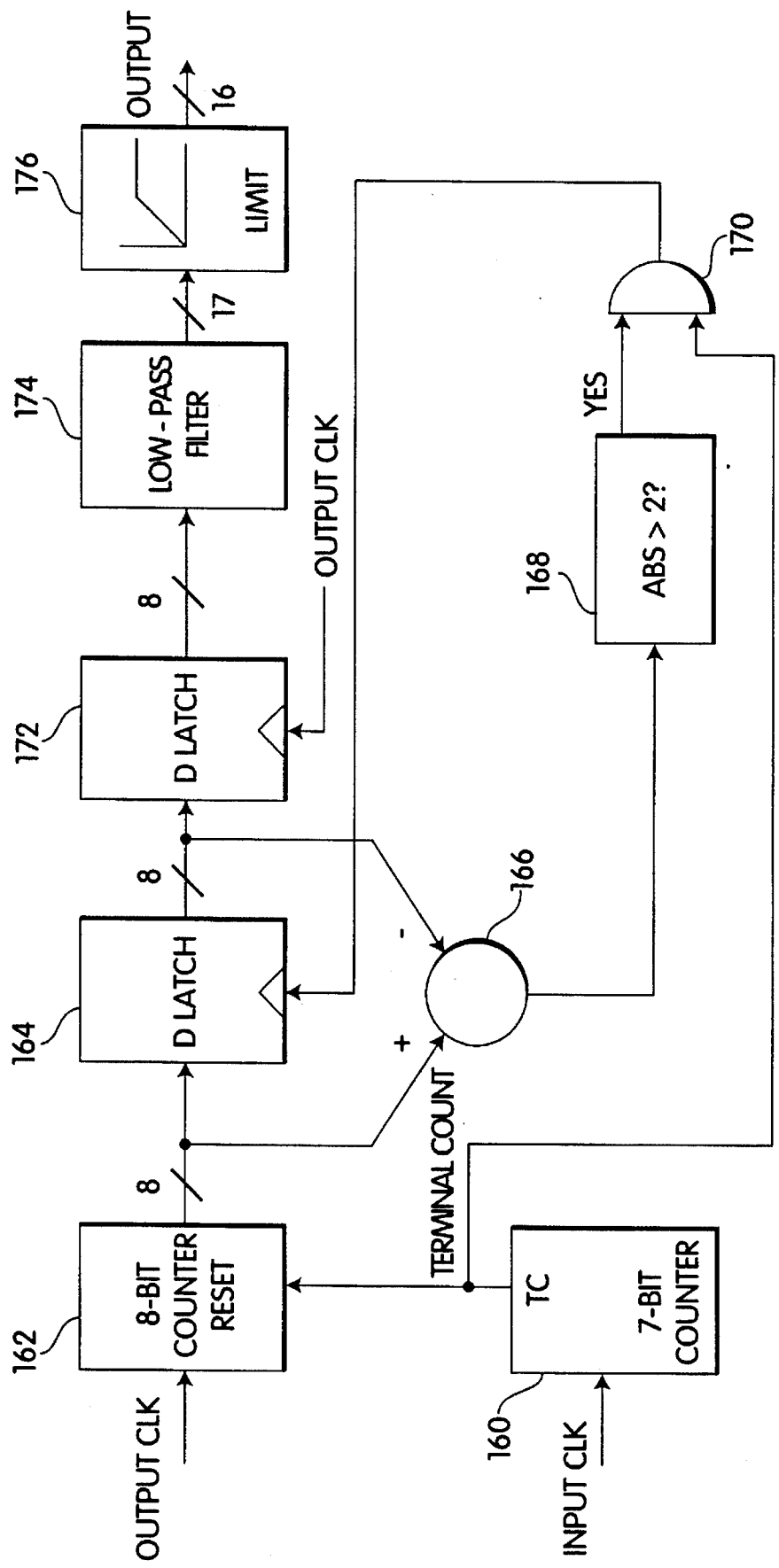
FIG. 11 is a block diagram of a circuit for generating the ratio of the output frequency to the input frequency.
Figure 12:
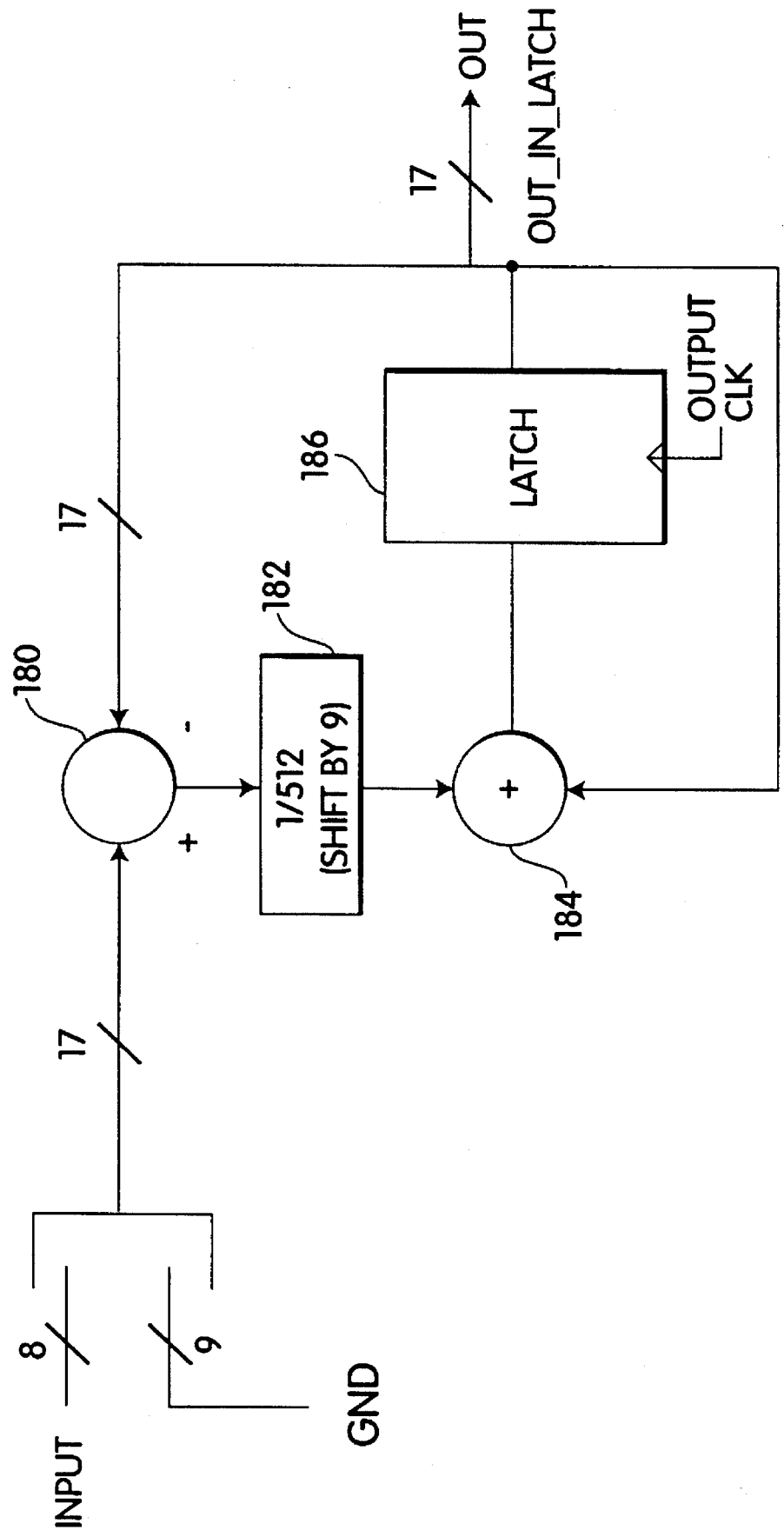
FIG. 12 is a block diagram illustrating a multiplier-free low-pass filter.

FIGS. 11 and 12 are block diagrams of a circuit for implementing this function. A 2-counter scheme is used to derive a signal related to the output to input sample rate ratio, scaled by the interpolation ratio. This signal is passed through a "dead band" circuit, the output of which is smoothed in a first-order low-pass filter. The smoothed output is applied to a clipper circuit that passes the input to the output if the input is less than (R), but holds the output at (R) if the input is greater than (R).

The output of this circuit could be used to multiply all memory addresses to the coefficient memory (ROM) 104, which would linearly expand the impulse response of the low-pass filter. This technique, however, would require one extra multiply operation per multiply/accumulate cycle, which represents a large overhead in terms of computational requirements. Instead, the first coefficient address is multiplied by the output of limiter 176, where this value is regarded as a fractional number less than 1. This same number is used as an increment value by the coefficient address generator 112 (FIG. 8), where it is used as a binary integer number. This automatically and correctly scales the frequency response of the FIR filter for either decimation or interpolation, without user interaction.

In FIG. 11, a 7-bit counter 160, clocked at the input sample rate, is used to capture the state of an 8-bit counter 162 clocked at the output sample rate. When the 7-bit counter 160 reaches its terminal count, it latches the state of the 8-bit counter 162 into latch 164 and resets counter 162. This circuit preferably has a "dead-band", so that a new value is not latched into the output unless it differs from the immediately previous value by more than two. Without such a dead band, the number produced by this counting scheme may vary by +/−1 depending on the exact phase relationship of the input and output samples. Since its output is used to modify the initial coefficient location and as the increment value for subsequent locations, any variation results in effective jitter of the time base, which is undesirable.

The dead band is implemented by a form of digital hysteresis. This involves taking the difference of the output of counter 162 and the output of latch 164 using a subtractor 166. If the absolute value of that difference is greater than 2, as determined by a threshold circuit 168, and if the terminal counter 160 is reached (the "and" function being performed by AND-gate 170), the output of latch 164 is allowed to change. Output sample requests drives the latch 172 which then latches the contents of latch 164. The contents of latch 172 are applied to a low-pass filter 174 which serves to smooth the changes in the ratio numbers under conditions of real-time variation of sample rates. Otherwise, a series of clicking sounds would be heard as the circuit settled to accommodate a new sample rate ratio.

Finally, a limiter 176 is applied to the output of low-pass filter 174 to provide an output limited to 1 (where the output is considered to be a fractional positive number). The low-pass filter 174 provides extra bits above what is applied to its inputs; its output is truncated to 17 bits and applied to limiter 176 that saturates at the interpolation ratio R (e.g., in the preferred embodiment $2^{16}$), where the output of the limiter is considered an integer.

FIG. 12 illustrates an implementation of the low-pass filter 174. This preferred implementation is similar to the implementation of the low-pass filter 120 in the feed forward cancellation path of the auto-centering scheme, described above in connection with FIGS. 8–10. This low-pass filter implementation is a multiplier-free architecture which simplifies an actual implementation. The input, to which 9 additional bits are added, is applied to a subtractor 180 which subtracts the output of the filter 174 from the input. The output of subtractor 180 is shifted in shift register 182 and then applied to an adder 184. The adder 184 subtracts the output of the filter from the shifted value, and applies the difference to a latch 186 which provides the output of the filter. The latch is driven, in this instance, by output sample requests.

Figure 13:
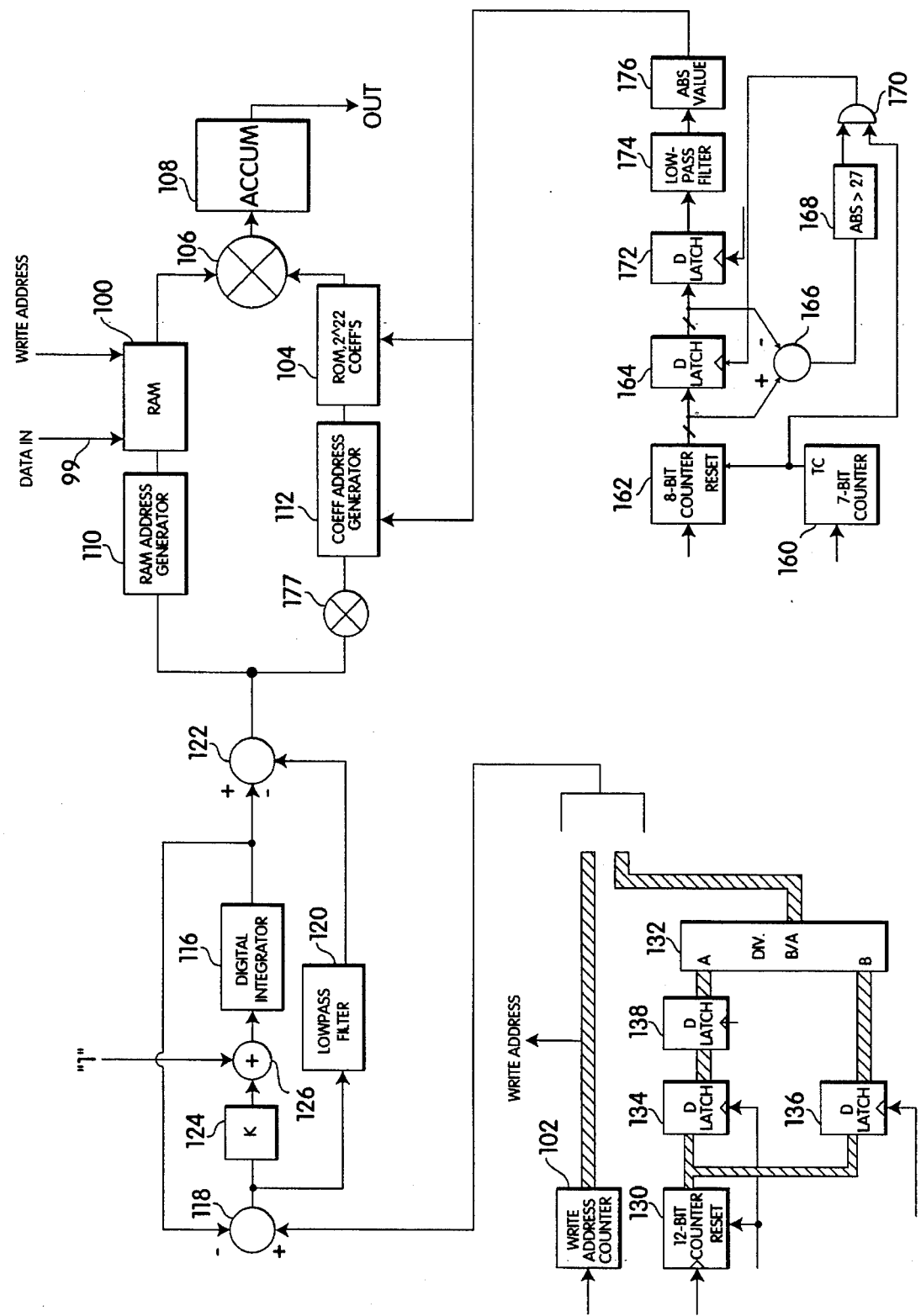
FIG. 13 is a block diagram of the preferred embodiment of the invention, enabling both interpolation and decimation.
Figure 14:
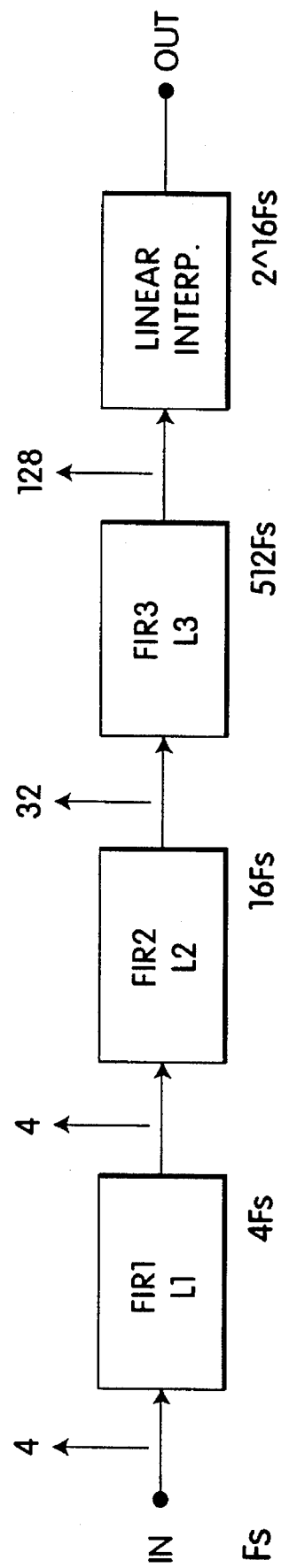
FIG. 14 is a block diagram illustrating how a 4 million tap digital interpolation filter was designed.
Figure 15:
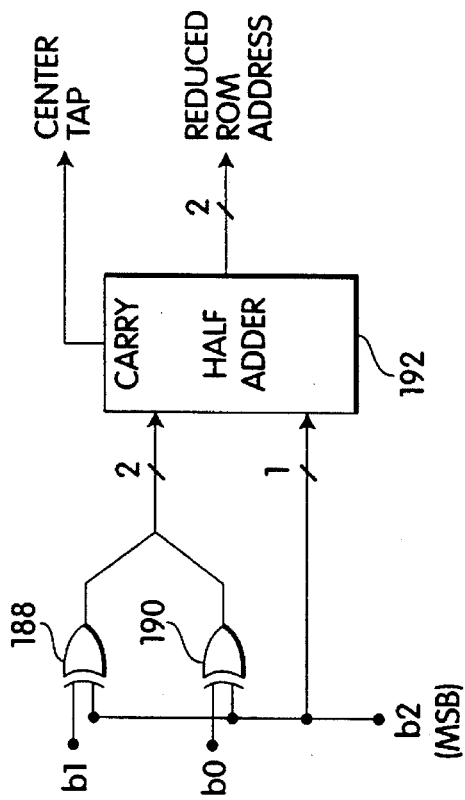
FIGS. 15A and 15B describe the address folding operation for reducing the number of stored filter coefficients.
Figure 16:
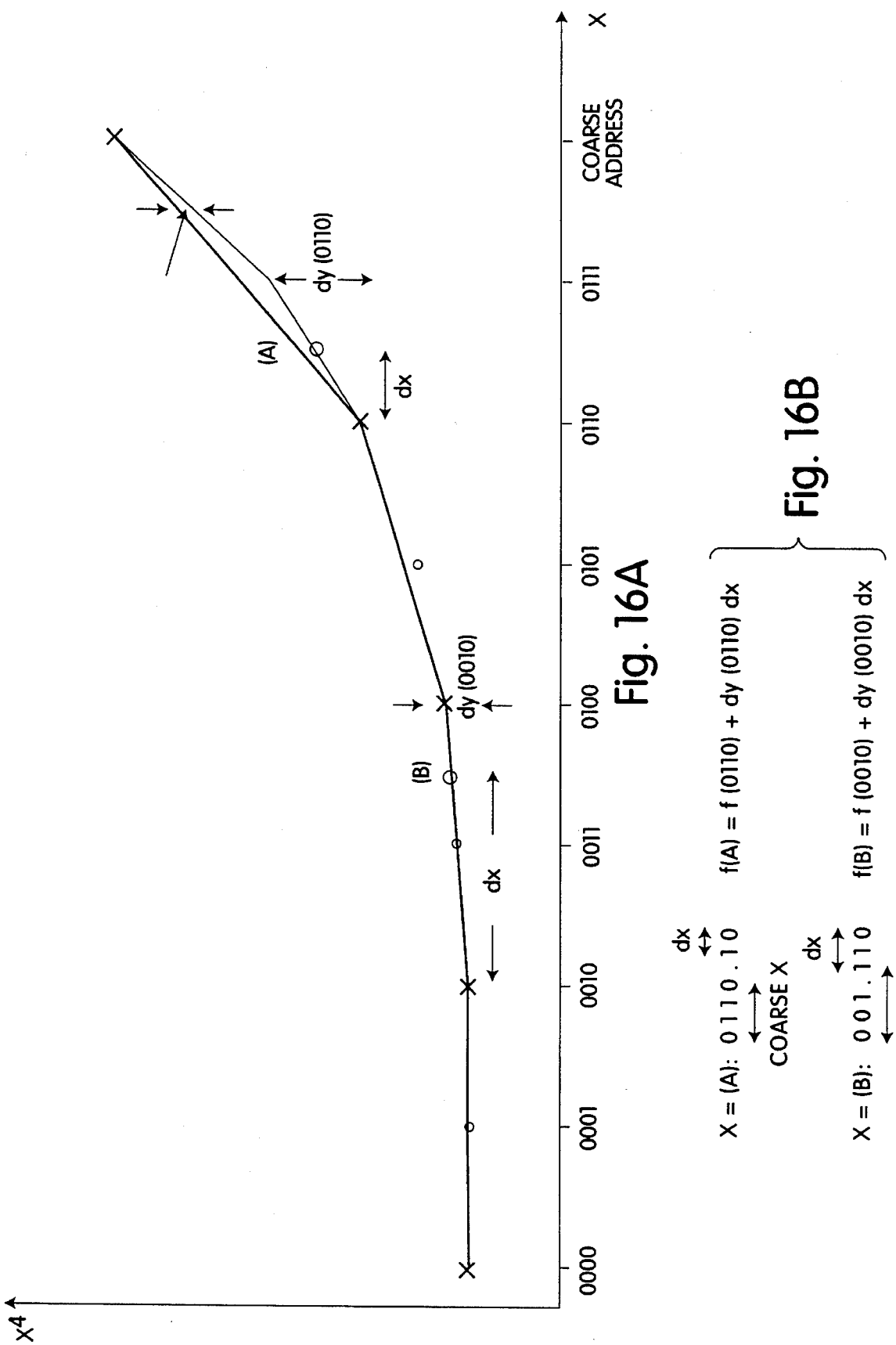
FIGS. 16A and 16B illustrate linear interpolation of filter coefficients.

A block diagram of the preferred embodiment, including feed forward cancellation, interpolated write addresses, and a frequency ratio circuit for adjusting the filter cut-off frequency for decimation, is shown in FIG. 13. Note that the output of the ratio circuit of FIG. 11, is used to scale (via multiplier 177) the first coefficient address and is used directly by the coefficient address generator 112 as the increment value for addressing the ROM.

Reduction of Stored Filter Coefficients

In the discussion above, it was assumed that a subset of all filter coefficients were stored in ROM, which were directly accessed according to computed coefficient locations with respect to a conceptual shift register. In practice, however, a reduced set of coefficient values is stored and interpolation is used to obtain correct coefficient values. A description of the preferred interpolation process will now be provided. This interpolation process is not limited to applicability with digital sample rate conversion. It may be used for all types of digital interpolation and decimation filters.

The interpolation filter for the preferred embodiment was designed using multi-rate techniques and commercially available computer filter design programs. Referring to the block diagram in FIG. 14A, filter FIR1 was designed at 4 $f_s$ (where $f_s$ is the input sampling rate) with a passband ripple of ±0.004 dB and a stopband attenuation of 120 dB. The passband and stopbands were 20 kHz and 24.1 kHz respectively. The images of filter FIR1 at multiples of 4 $f_s$ were suppressed by filter FIR2 with similar specifications but with a stopband at 4 $f_s$–20 kHz. In return, the images of filters FIR1 and FIR2 at multiples of 16 $f_s$ were attenuated by filters FIR3. When convolved together, the cascade of filters FIR1, FIR2 and FIR3 gives an impulse response of length $$32[4 L_1+(L_2-1)]+L_3-1$$

where $L_1$, $L_2$ and $L_3$ are the filter lengths of FIR1, FIR2 and FIR3 respectively. The final filter stage is a linear interpolation filter of length 128, bringing the total length of the filter to 4,194,304 taps. Accordingly, without further reduction, the interpolation filter designed above requires storage for coefficients for 4,194,304 taps. In the following, three techniques for reducing the number of coefficients stored are described. Taken together, they may reduce the filter coefficient storage requirements by a large factor.

One reduction technique involves taking advantage of the symmetry of the filter impulse response. By "folding" the address input to the ROM, the storage requirements are immediately cut in half. An example is shown in FIGS. 15A and 15B, for a 7 tap filter.

FIG. 15A is a table which converts an input address to a 2's complement number representing the folded address, and the corresponding ROM content. FIG. 15B is a block diagram circuit implementing this mapping. It includes exclusive-or (XOR) gates 188 and 190 which XOR, respectively, b with b2 and b0 with b2. The outputs of the XOR are concatenated and then added to b2 by half adder 192. The carry bit of the half adder indicates the selection of the center tap, while the two output bits indicate the location of the coefficient in a reduced ROM. It is possible to eliminate the half-adder by redesigning the highly interpolated filter such that the point of even symmetry for the filter coefficients falls in between two taps instead of at a single center tap. This can be done by interpolating the original set of coefficients by 2, the sampling the resulting filter coefficients to obtain two poly-phase filters. The poly-phase filter with a half-period delay exhibits even symmetry about a point between two taps.

Another feature of the impulse response used to reduce the number of stored coefficients is its relatively small change from sample to sample (i.e., its smoothness). Instead of storing each one of the over 4 million filter coefficients, intermediate points can be dropped and recalculated using linear interpolation. Simple linear interpolation could be used to reduce the number of coefficients by a factor of 128 (to 32 K). For efficient integration into VLSI, however, 32 K coefficients still require a formidable amount of storage.

Another problem with conventional linear interpolation is that the approximation error depends on the curvature (second or higher derivatives) of the approximated function which may vary. For example, FIG. 16A shows a small segment of the function $x^4$ being linearly interpolated. Along the X axis is the coarse address (i.e., the address provided, but for which its corresponding value is to be interpolated). If only the points marked with an "x" are used (5 in total), a large error is incurred near coarse address 0111. To lower this error, a finer time grid could be used for interpolation, but that would unnecessarily increase accuracy for certain parts of the function (i.e. the left side).

Storage requirements and error can both be reduced by linearly interpolating using a variable step size. The first step in implementing variable step size interpolation is to divide the input address space of the function into a number of segments. Each segment is assigned an interpolation factor which is determined by the maximum error allowed. In the example in FIG. 16A, the function can be split into 4 segments and assigned interpolation ratios of 8, 8, 8, and 4 respectively. The input ROM address is collapsed (i.e., mapped) into a reduced address space where all function points are stored. In FIG. 16A for example, the input addresses (coarse X) 0000 and 0001 can be mapped into certain MSB's of the ROM address e.g., 000. If the linear interpolation step size is changed by powers of two, automatic scaling of the step size dx can be done by a simple shift of the input address. This is illustrated by the two example calculations in FIG. 16B.

The input address mapping and its associated shift in powers of two are derived from the slope of the filter coefficients and the maximum tolerable error from linear interpolation. The range of input addresses are divided into regions, each of which are mapped to a step size. Once derived, this mapping may be programmed into a programmable logic array (PLA), or other logic circuit such as a ROM. The mapping is encoded in the logic circuit so that, given an input address, the output is an appropriate shift to the shift register. How to encode such mappings in a PLA or other logic circuit is well-known in the art.

Figure 17:
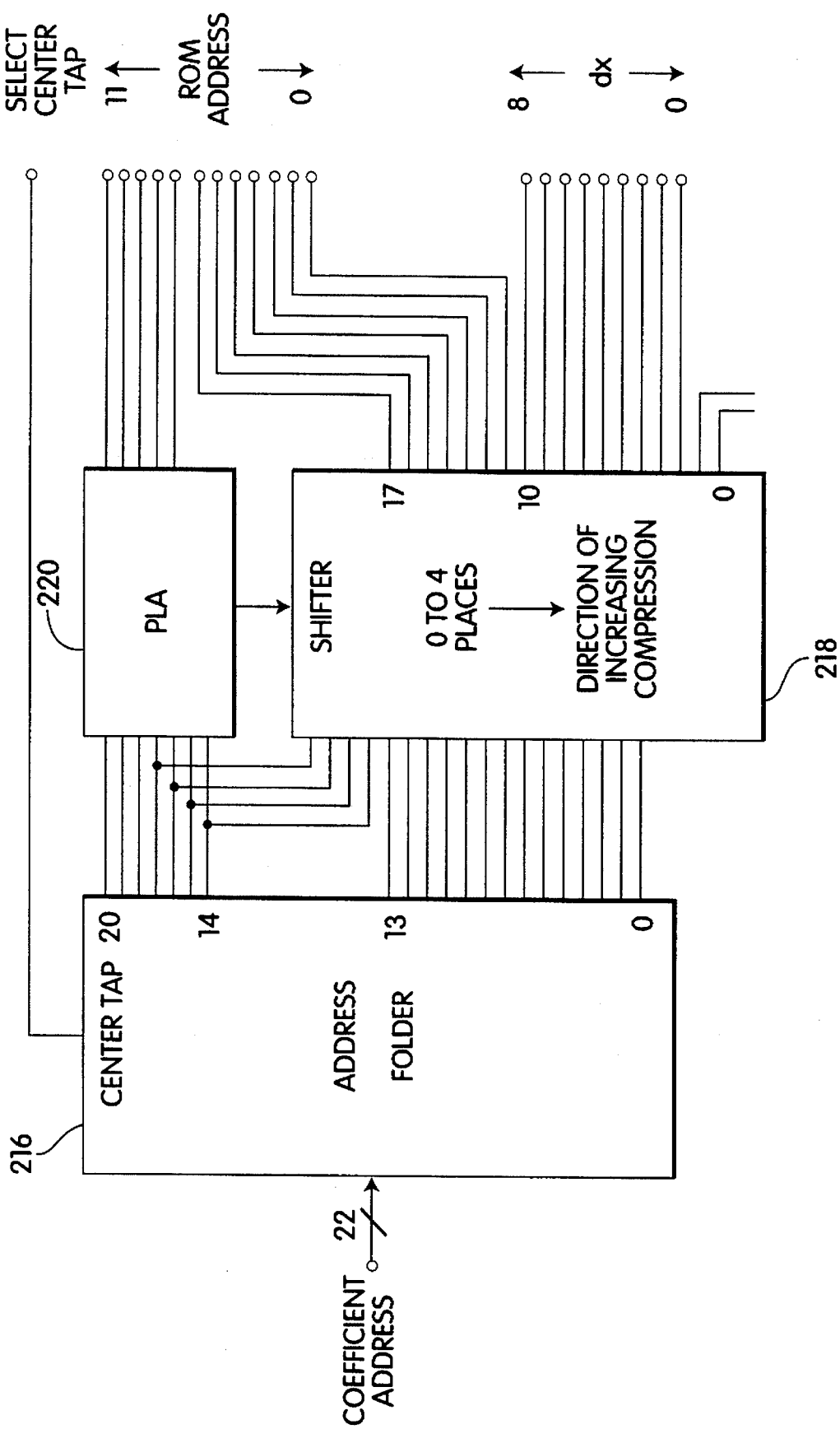
FIG. 17 is a block diagram of a circuit used in variable step size linear interpolation of filter coefficients.

One implementation of a circuit that generates the ROM segment translation and variable slope interpolation scaling is shown in FIG. 17. This circuit includes an address folder 216 as described above. The output of the address folder is fed to a shifter 218 and a PLA 220. The output of the PLA 220 provides the upper bits of the ROM address and the shift control to shifter 218. The shifter 218 provides the lower bits of the ROM address and the bits of 'dx', a fractional value. The PLA is used for ROM address translation while the shifter is used to compensate for the different step sizes used in this linear interpolation scheme by providing a scaling function.

For ROM segments having the least compression, there is no shift in the address out of the address folder 216 into the ROM; i.e., bit 13 of the folder moves to bit 17 of the shifter 218, which becomes bit 6 of the ROM address. As the input address is moved to a segment in which the interpolation step size doubles, the shifter moves bit 14 (instead of bit 13) of the folder to bit 6 of the ROM address. Thus, the input address steps through the ROM at half its previous rate (using less ROM storage). To correct for the new interpolation step size, the fractional part of the ROM address (i.e., the lower bits that determine how far an input address is away from a stored coefficient) has to be scaled by 2. This is accomplished by shifting the input address output from the address folder 216 down by one bit.

For the filter impulse response coefficients described above, 128 segments were chosen. This technique resulted in a reduction by a factor of four in storage requirements.

If the difference between successive function values for linear interpolation is stored, the hardware required for its implementation may be simplified greatly. An example of this is shown in FIG. 18A for the $x^4$ case.

Figure 18A:
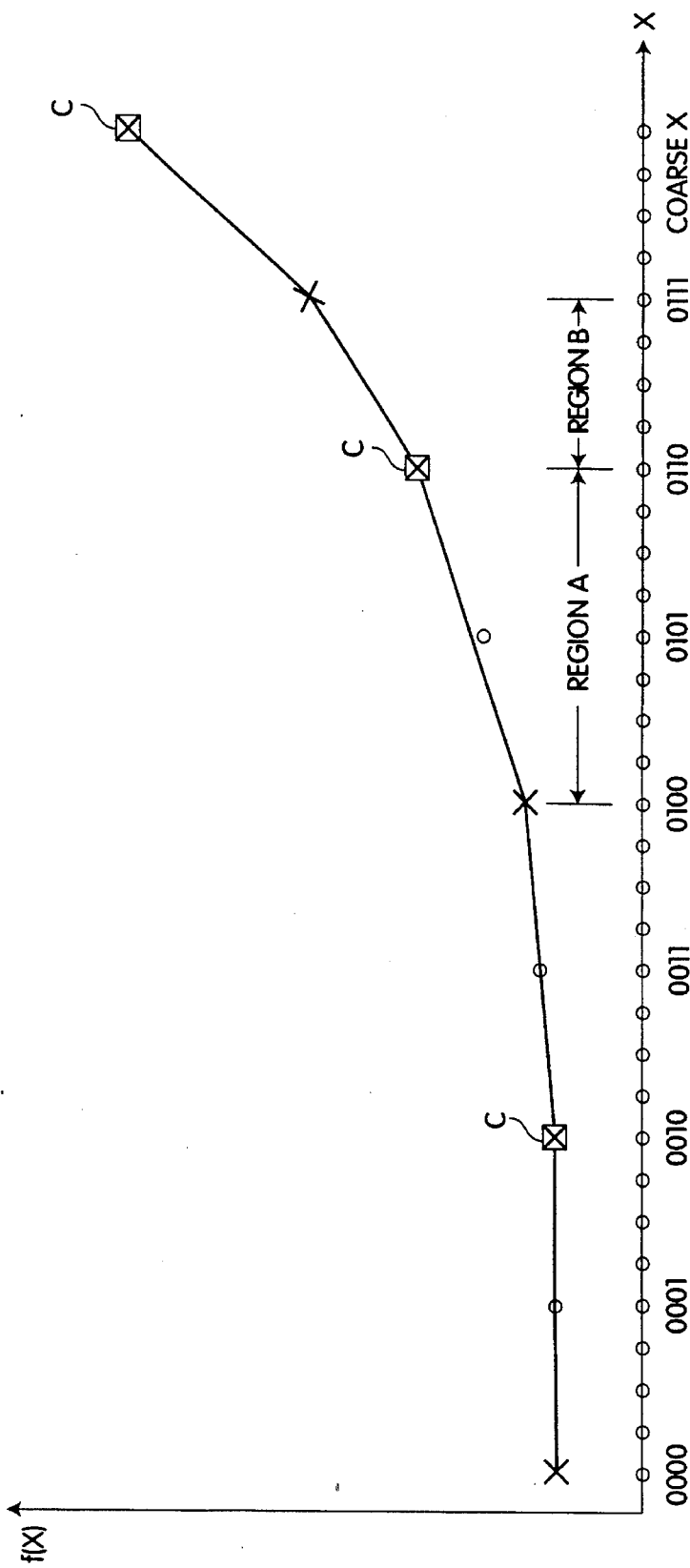
FIGS. 18A and 18B describe variable step size linear interpolation.

Defining the difference between two consecutive function samples $f_2-f_1=dy_{21}$ in a segment, such as region A in FIG. 18A the linearly interpolated value of the function in between these two samples is:

$$f(x)=f_1+dxdy_{21}$$

where dx is the "fractional part" of the input address x as defined above. Similarly for the next segment (region B):

$$f(x)=f_2+dxdy_{32}$$

For a function with 4 k stored points, this requires 4 k dy's as well. Regarding a first region A in FIG. 18A, one can also interpolate backwards from $f_2$ by using the formula:

$$f(x)=f_2-(1-dx)dy_{21}$$

which can be rewritten as:

$$f(x)=f_2+(dx-1)dy_{21}$$

Figure 18B:
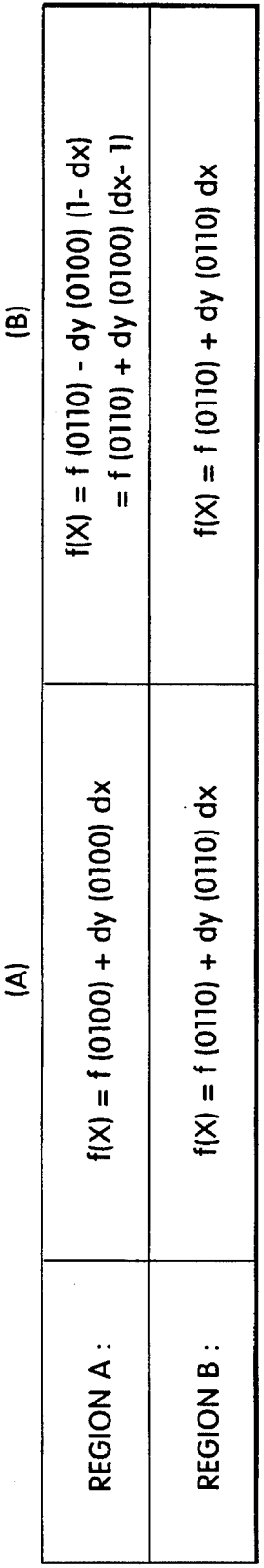

Thus, the storage of $f_1$ is redundant and every other function sample may be dropped, thus retaining only points C in FIG. 18A. Since dx is a fractional number, a two's complement version of (dx–1) can be generated simply by appending a sign bit of 1 to dx. FIG. 18B compare-the interpolation functions (A) and without (B) this modification.

Figure 19:
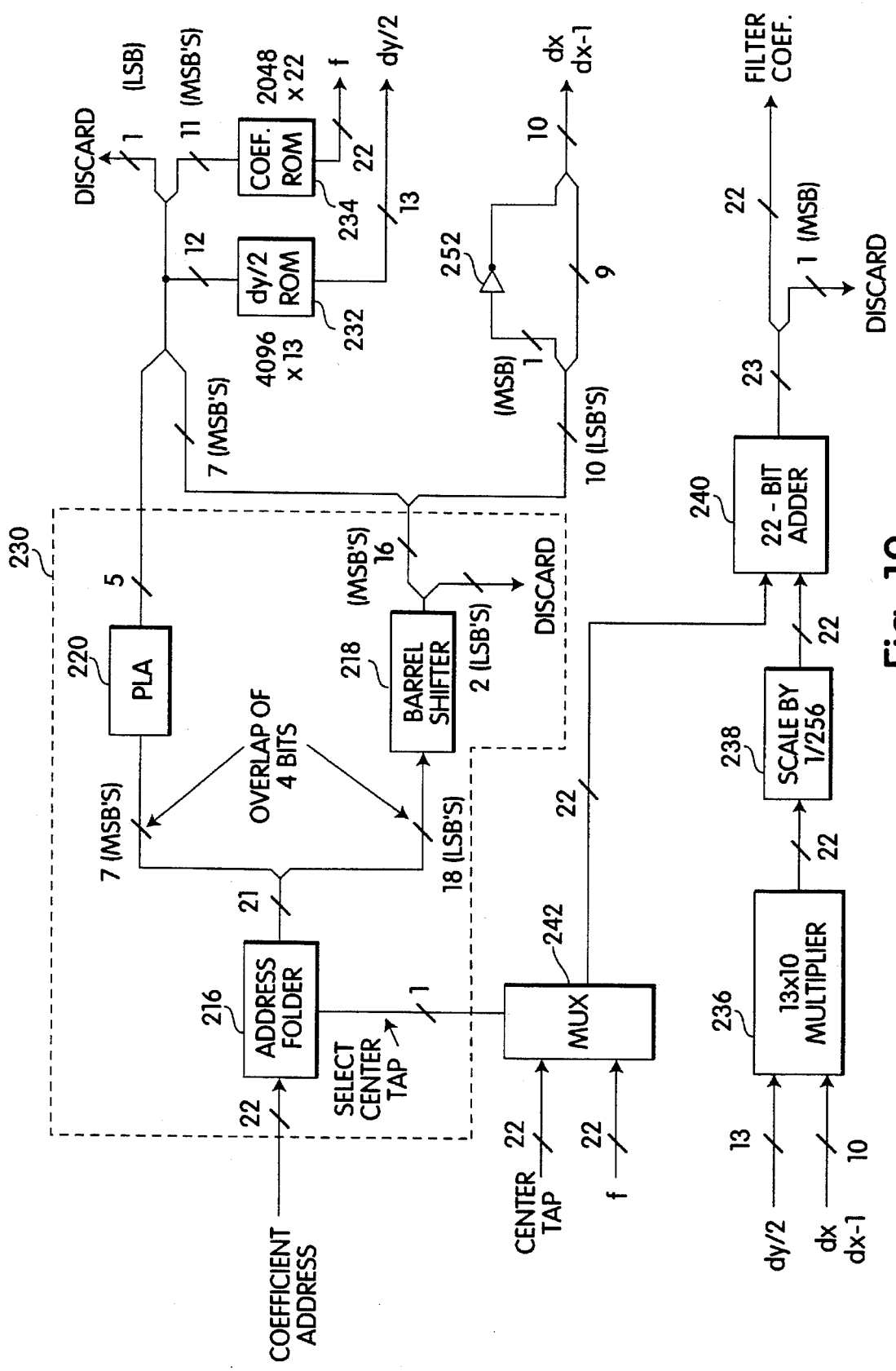
FIG. 19 is a block diagram of illustrating the preferred method of the invention for reducing the number of stored filter coefficients.

A block diagram for a circuit implementing these three techniques is shown in FIG. 19. The variable step size linear interpolation, along with the address folder, as described above in connection with FIG. 17, is shown at 230 in FIG. 19. The ROM address from circuit 230 is provided to the read only memories storing the coefficients (234) and the dy/2 values (232) to obtain, respectively, a filter coefficient value f and a dy/2 value. The input from circuit 230 is passed to inverter 252 which inverts only the most significant bit of a value to generate the appropriate 2's complement value for forward or backward interpolation as described above. The dy/2 value and the dx or dx–1 value is fed to a multiplier 236 whose output is scaled by 1/256 by divider 238. The output of divider 238 is added to either the coefficient value or the center tap value by adder 240. The selection of either the center tap value or a filter coefficient value is determined via a multiplexer 242 as driven by the center tap select value from address folder 216. The most significant bit of the output of the adder 240 is discarded and the remaining bits provide the desired filter coefficient corresponding to the input coefficient address.

The bit that determines whether a forward or backward interpolation is to be performed is bit 11 of the barrel shifter 250. A "1" implies forward interpolation, while a "0" implies backward interpolation. Thus, an inverter 252 is all that's needed to generate the signal 1–dx for backward interpolation. The final ROM sizes are 4096×13 for dy values and 4096×22 for the filter coefficients.

Figure 20A:
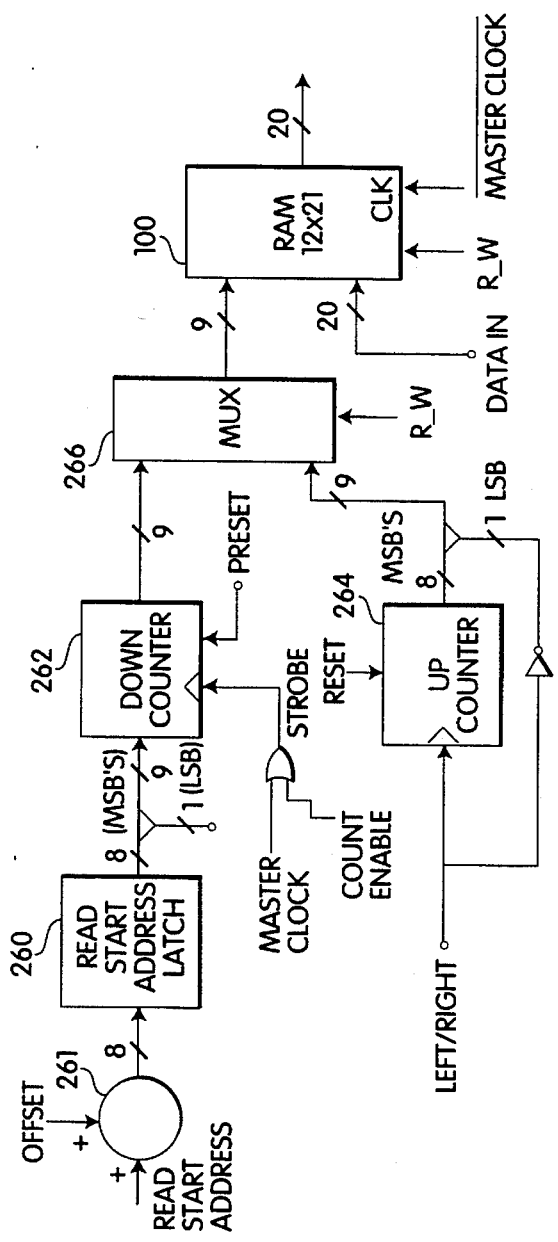
FIGS. 20A and 20B describe in more detail the read address generating circuit.

Having now described the generation of interpolated filter coefficients (via FIGS. 14–19), and the generation of an initial read start address for the memory storing input data values, in connection with FIGS. 6–13, the generation of successive read address by the RAM address generator 110, and corresponding successive coefficient addresses by coefficient address generator 112, will now be described in connection with FIGS. 20 and 21.

A block diagram of the RAM address generator 110 is shown in FIG. 20. For the purposes of the preferred embodiment, input data is assumed to be received from two (left and right) channels, although each left or right data value generates its own write request signal. It is also assumed that for each time period, left channel data is received before right channel data. Left channel data is stored at even addresses while right channel data is stored at odd addresses. Left and right input data values which are related in the same time instance are processed together by the multiply/accumulate engine (described below). For this purpose, right channel data is read from the RAM 100 first before left channel data. This is because the sequencing of RAM addresses for reading is opposite that for writing.

A read start address latch 260 holds the read start address which is received from the auto-centering circuit once every output sample request. Before it is latched, an offset is added by adder 261 to the read start address so as to center it as far from the write address as possible. To guarantee that multiply-and-accumulate operations begin with reading the right channel, a "1" is appended to the LSB of the read address start after the output of latch 260. Upon the arrival of an output sample request, a down counter 262 is preset with the read start address and then is decremented with each multiply and accumulate operation. The down-counter 262 decrements in response to a strobe signal, which is the "OR" of the master clock signal and a count enable signal, which will be described in more detail below. Here the master clock signal is one-half the actual master clock (e.g., 8 MHz if the actual master clock is 16 MHz).

On the write address side, a "left/right" user-supplied signal is used to generate the LSB of the write address to differentiate input data between left and right channel data. The "left/right" signal also drives the counter 264 which provides the higher bits of the write address. The least significant bit of the write address is ignored for the purposes of the auto-centering loop. The read and write addresses are fed to the RAM 100 via multiplexer 266, which is controlled via a read/write (R_W) signal.

The RAM 100 assumes the use of a precharge signal which is provided by the complement of the master clock signal. There is a limit of 62.5 ns, for the preferred embodiment, for the delay taken up by the down counter 262, multiplexer 266 and RAM address setup time. Likewise, the RAM access time plus the setup time of any latch reading the data from RAM 100 must also be less than 62.5 ns. Depending on the read/write and address hold time requirements of the actual RAM used, the R_W and RAM address signals from multiplexer 266 may have to be delayed by half of a master clock cycle.

Figure 20B:
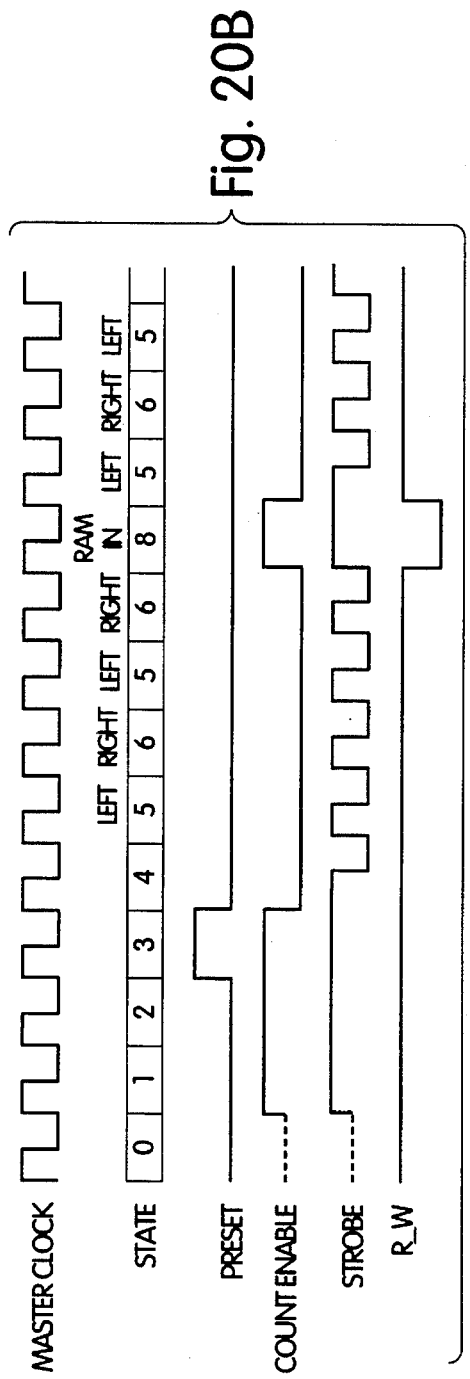

A timing diagram of this circuit is provided in FIG. 20B. This diagram will be described in more detail below in connection with the description of a state machine controller for this embodiment.

Figure 21A:
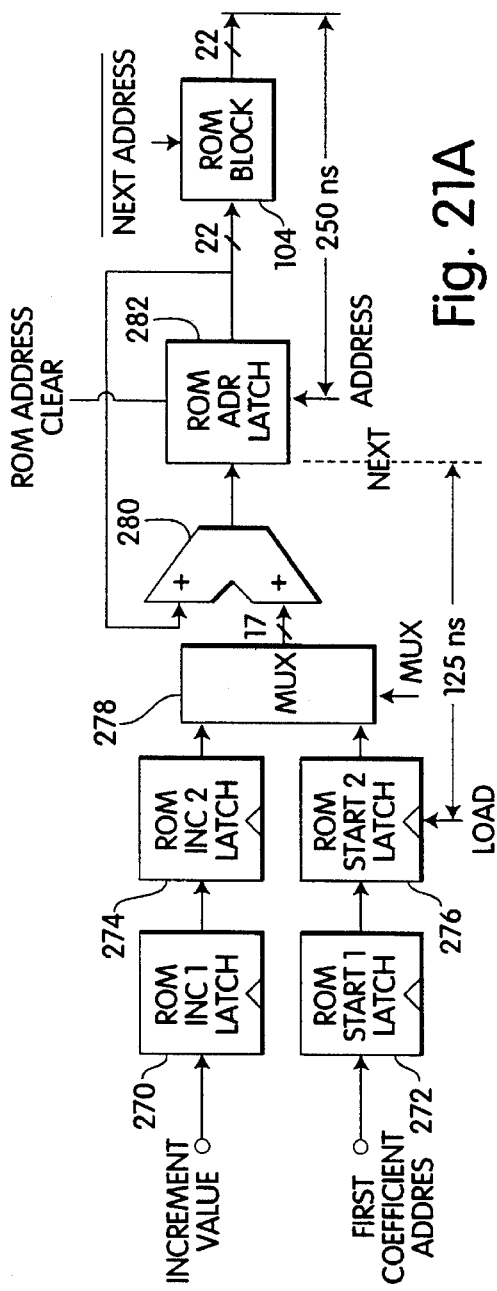
FIGS. 21A and 21B describe in more detail the coefficient address generating circuit.

A block diagram of an embodiment of the coefficient address generator 112 is shown in FIG. 21A. The purpose of this circuit is to deliver the requested set of filter coefficients to the multiply-and-accumulator block. This set of coefficients is determined by the first coefficient address and the increment value which are updated once every output sample request.

The coefficient address generator 112 includes a first ROM increment latch 270 which latches the increment value from the circuit of FIG. 11 upon each output sample request. Similarly, there is a first ROM start address latch 272 which latches the first coefficient address upon each output sample request. Both latches 270 and 272 feed respectively to second ROM increment latch 274 and second ROM start latch 276 to provide a double buffering function and which are loaded in response to a load signal, whose generation will be described in more detail below in connection with the description of the state machine controller.

The output of latches 274 and 276 are fed to a multiplexer 278 which selectively provides the increment value or the first coefficient address to an adder 280. The output of adder 280 is fed to a ROM address latch 282 which is loaded in accordance with a "next address" signal. The latch 282 is cleared to zero when it receives a signal, here named "ROM address clear". The output of the ROM latch 282 is fed back to the second input of adder 280. This output is also fed to the ROM block 104. In the preferred embodiment of the invention, the ROM block 104 is represented by the circuit as shown in FIG. 19.

The operation of the coefficient address generator 112 will now be described. Upon the arrival of an output sample request, the ROM address latch 282 is cleared. The contents of ROM start latch 276 are loaded into latch 282 via multiplexer 278 and adder 280. (Adder 280 adds zero to the loaded address). The multiplexer 280 is then switched to feed the increment value from latch 274 to the adder 280. Since the ROM address value can be used for the multiply and accumulate operations for both the left and the right channel values, a new ROM address is generated once every two multiply-and-accumulate cycles. In the preferred embodiment, a new filter coefficient is generated once every 250 ns.

Figure 21B:
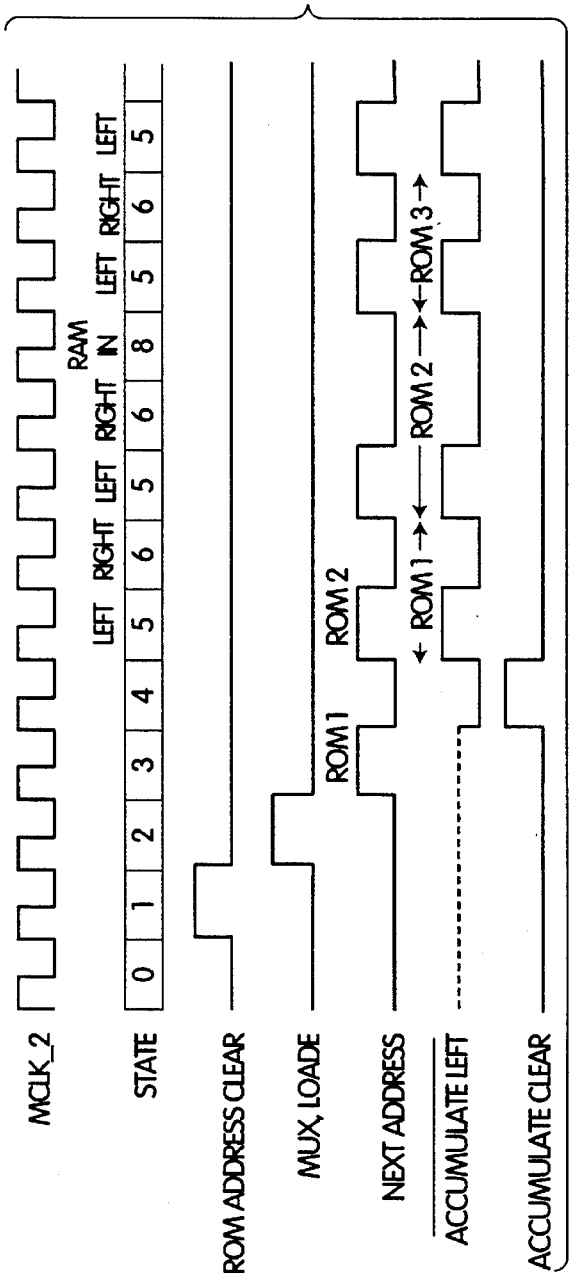

A timing diagram for control of this circuit is shown in FIG. 21B. It will be described in more detail below in connection with the description of a state machine controller for this embodiment.

Figure 22:
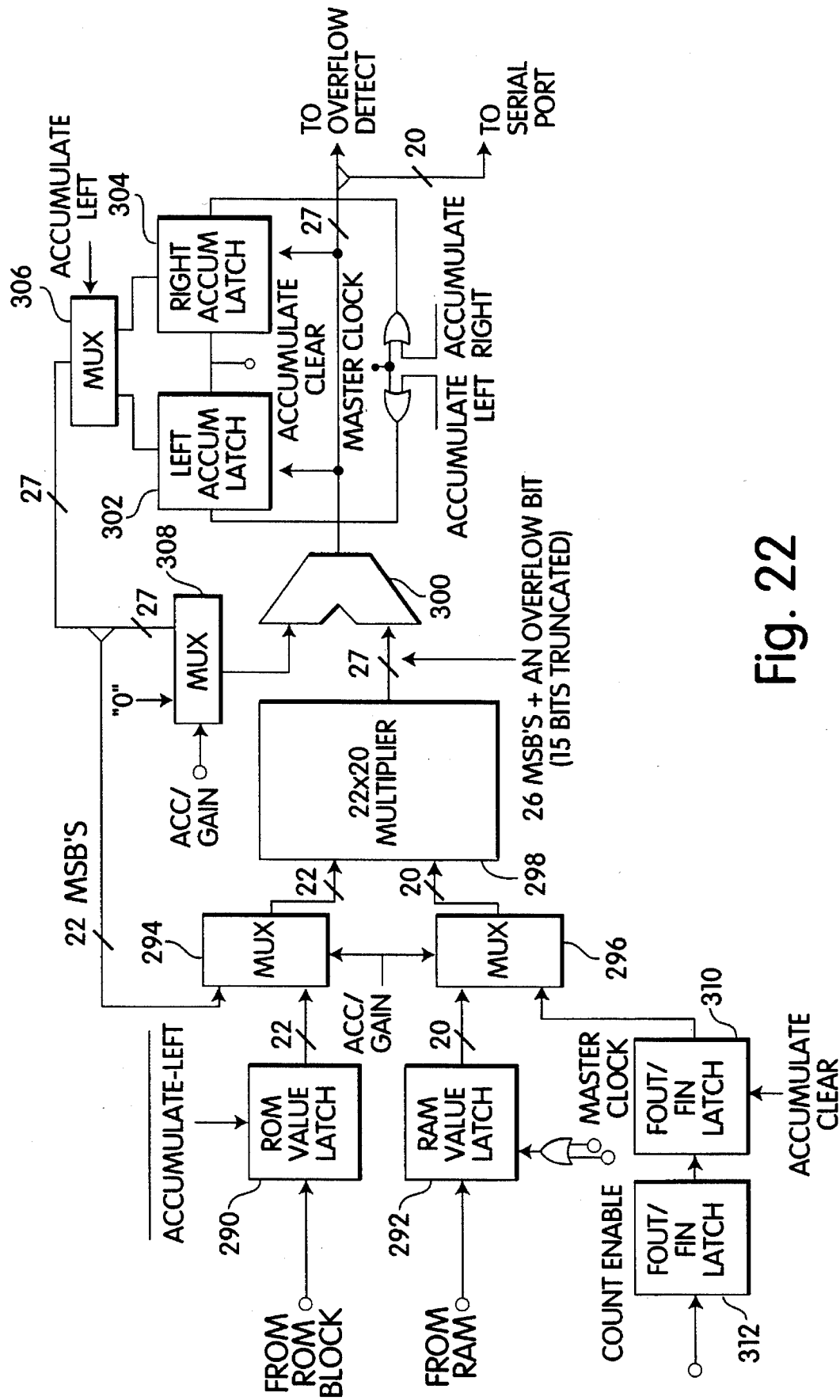
FIG. 22 is a block diagram of a preferred embodiment of a two-channel multiply accumulator engine.

A block diagram of a two channel multiply-and-accumulate circuit is shown in FIG. 22A. This circuit has two modes of operation described in more detail below. When an output sample request is detected, it is in the accumulate mode. When multiply/accumulate operations are complete, the circuit switches to gain mode.

The filter coefficient from ROM block 104 is latched by ROM value latch 290. The input data value from RAM 100 is latched by RAM value latch 292. ROM value latch 290 is loaded in response to the complement of an "accumulate left" signal. RAM value latch 292 is loaded in response to the "OR" of the master clock (still at 8 MHz) and a count enable signal. These signals and other control signals described herein will be described in more detail below in connection with the description of a state machine controller for this embodiment.

The outputs of ROM value latch 290 and RAM value latch 292 are respectively fed to multiplexers 294 and 296 which are controlled by an accumulate/gain signal which controls the mode in which this circuit is operating. The output of multiplexers 294 and 296 are fed to a multiplier 298. The output of multiplier 298 is fed to an adder 300. The output of adder 300 is fed to the inputs of the left and right accumulate latches 302 and 304, respectively.

The values of latches 302 and 304 are set to zero by an accumulate clear signal. The output of adder 300 is loaded into either the left or right accumulate latch according to an accumulate left or accumulate right signal, "OR"ed with the master clock (e.g. 8 MHz). The output of the right and left accumulate latches 302 and 304 is fed to a multiplexer 306 whose output is fed both to multiplexer 308 and multiplexer 294. Multiplexer 306 is controlled by the accumulate left signal, to provide either the left or right accumulate values to the adder 300 and multiplier 298. Multiplexer 308 is also controlled by the accumulate/gain signal along with multiplexers 294 and 296 described above.

The operation of this circuit in accumulate mode will now be described. In accumulate mode, the ROM value and RAM value in latches 290 and 292, respectively, are fed to multiplier 298. The output of multiplier 298 is fed to adder 300. For each filter coefficient in latch 290, there are two subsequent input data values corresponding to right and left channel values. Thus, the left value output from adder 300 goes to left accumulate latch 302 whereas the right value goes to right accumulate latch 304.

As was described above, the bandwidth of this filter was reduced for decimation by increasing the length of the filter impulse response and by reducing the increment value for the coefficient addresses. Since, in the preferred embodiment, the original filter was designed to have a passband gain of one by 64 taps, having more taps gives a passband gain of greater than one. To maintain a gain of one, the filter output is scaled in the gain mode, described below, by a factor equal to the output to input sample rate ratio.

In the gain mode, the values of the left and right channel accumulator latches 302 and 304 are fed back to the input of the multiplier 298. The other operand of the multiplier 298 is received from a second Fout/Fin latch 310. This value is latched from a first Fout/Fin latch 312 providing a double buffering function, which upon receiving an output request latches the value output from the circuit described in FIG. 11. Thus, the final result of the multiply/accumulate operation is scaled by the ratio of the output frequency to the input frequency, to ensure a passband gain of 1. Therefore, the gain mode is required to scale the output of the filter when the output sample rate is less than the input sample rate.

As should be apparent from the above description, this multiply/accumulate engine does not require a high frequency clock related to the input sample rate. An independent master clock may be used.

The above circuit, in the preferred embodiment is controlled by a state machine sequencer which will now be described in connection with FIG. 23. The sequencer provides control signals for initialization, ROM and RAM address generation, filtering (multiply-and-accumulate operations) and filter gain scaling. In addition, when data is available in the input serial port, ready to be written to the RAM buffer, the sequencer may interrupt operation to service the RAM write request. The sequencer is idle until a request for an output sample is received. The sequencer has 11 committed states with 3 inputs and 15 outputs.

Figure 23:
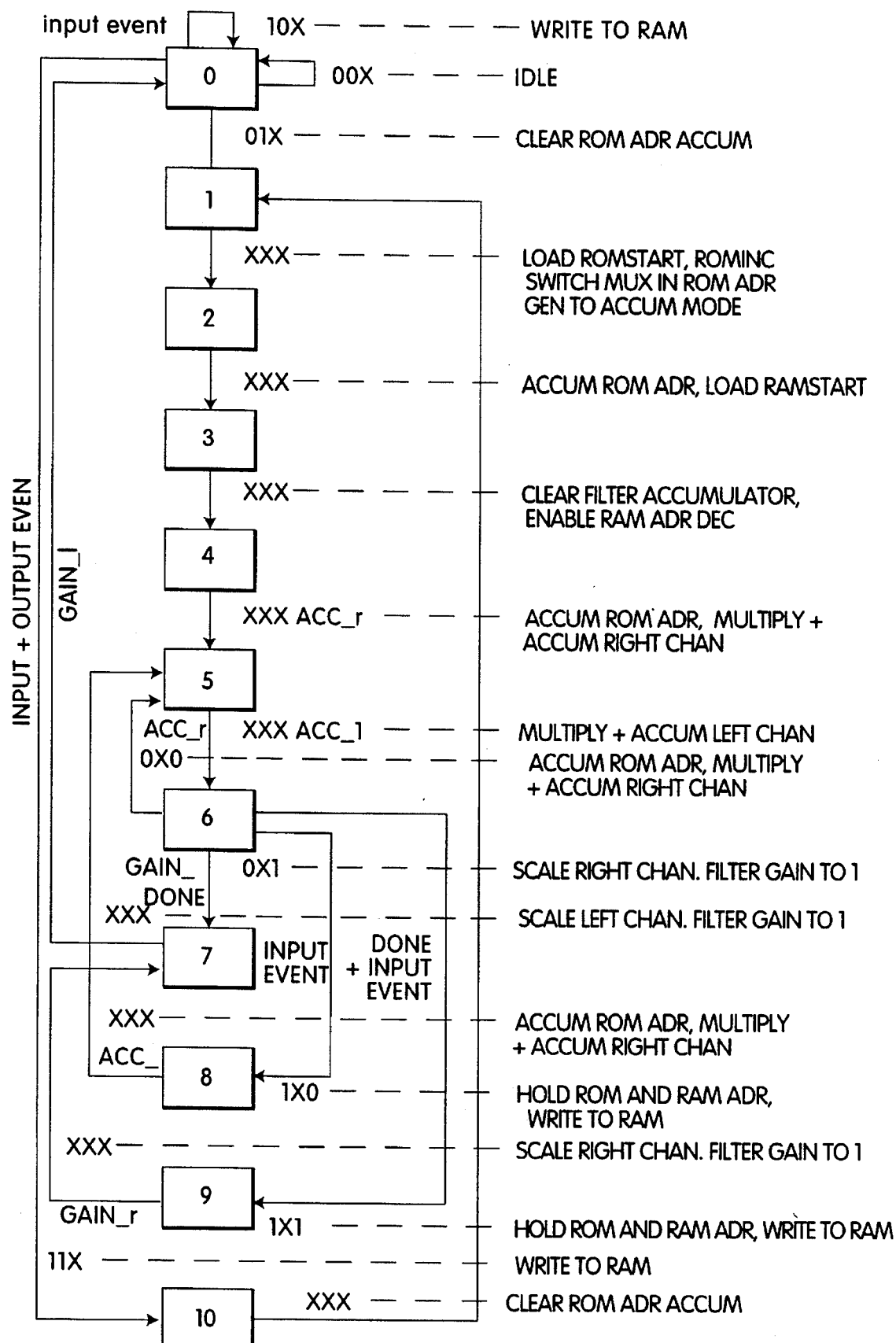
FIG. 23 is a state diagram for a state machine controller for controlling the multiply/accumulate engine.

FIG. 23 shows a state transition diagram of the sequencer, along with instructions that are executed between state transitions. The operation of the sequencer can be divided into 4 parts in which three of the parts are interruptible by an input event. These four parts are:

1. Idle (state 0): when there are no inputs or output events.
2. Initialization (states 0-1-2-3-4): to initialize address generators and accumulators for multiplying and accumulate operations.
3. Multiply and accumulate right and left channel (states 4-5-6-5).
4. Scale right and left channel (states 6-7-0).

During initialization (which has a duration of four master clock cycles), an input event interrupt is saved but is not serviced until state 6 of the multiply/accumulate operation is reached.

The three inputs to the sequencer are:

1. Input write request (input event): When this signal goes to logic high, it implies that input data is available at a serial port and is ready to be transferred to the RAM 100. Separate write requests are assumed for left and right channels.
2. Read request (output event): A logic high from this signal implies that an external device, receiving input from the sample rate converter, requires a sample.
3. Done: When an output sample request is pending, the filter engine computes the output sample by a series of multiplying and accumulate operations. The set of filter coefficients used is read from a ROM address which begins at the first coefficient address and is incremented by steps according to an increment value. When this ROM address exceeds the size of the ROM ($2^{22}$ in this embodiment), the multiply/accumulate operation is complete and this signal goes to logic high signaling to the sequencer that multiply/accumulate operations are done.

The outputs from the sequencer to the various other components of the sample rate converter are the following:

1. For the RAM address generator 110: (see FIG. 20A)

a. preset—Initializes down counter 262 with the read start address.

b. count enable—Enables the down counter 262 to decrement. It is also fed to RAM value latch 292 (FIG. 22) to enable clocking when the multiply/accumulate engine is in multiply-and-accumulate mode.

2. ROM address generator: (see FIG. 21A)

a. load—Loads the starting ROM address and ROM increment from first level buffer register (latches 270, 272) to second level buffer register (latches 274, 276).

b. ROM address clear—Initializes the ROM address accumulator latch 282 to zero.

c. mux—It is initialized to pass the first coefficient address from ROM. Start latch 276 to adder 280. Later it is charged to pass the increment value from latch 274.

d. next address—Strobes the ROM address accumulator 280 and 282 to generate the next ROM address. Its complement is used as a precharge signal for the ROM 104.

3. Two channel multiplier and accumulator: (see FIG. 22)

a. count enable, discussed above.

b. accumulate left, accumulate right—Enables latching (by latches 302, 304) of new multiply and accumulate results for the left and right channels, respectively.

c. acc/gain—Determines whether the multiply/accumulate engine is in multiply and accumulate mode or filter gain adjustment mode.

d. accumulate clear—Clears the contents of both the left and right accumulator latches 302 and 304 and loads the output to input sample rate ratio from the first Fout/Fin latch 312 to the second (310).

The function of the state machine sequencer will now be described in connection with FIG. 23. When the sequencer is idle, in state 0, and an input event occurs, it remains in state 0. Since the read write (R_W) signal is high, input data can be written directly to RAM 100 (see FIGS. 20A and 20B). If both input and output events occur, the input data is written to RAM and the state machine goes to state 10. In state 10, it automatically transitions to state 1, setting the ROM address clear signal to clear the ROM latch 282 (see FIG. 21A and 21B). Referring to the timing diagram of FIG. 21B, the state sequencer next transitions to state 2 where the mux and load signals are asserted to load the ROM increment and first coefficient address values into latches 274 and 276 respectively (FIG. 21A). The state machine sequencer then goes to state 3 to load the read start address into latch 260 while the first coefficient address is loaded into the ROM address latch 282. (See FIGS. 20 and 21). The sequencer then transitions to state 4, clearing the right and left accumulate latches 302 and 304 (FIG. 22) by asserting the accumulate clear signal (FIG. 21B). the down counter 262 is enabled with the count enable The preset signals, along with the master clock to form an input "strobe" signal to the down counter.

The multiply and accumulate stages are then begun by the sequencer as it transitions to states 5 and 6. In states 5 and 6, right and left accumulate operations are performed while the down counter 262 decrements according to the strobe signal (FIG. 20), and the ROM address changes, according to FIG. 21B. If an input event occurs during the multiply and accumulate cycles, when the state machine sequencer reaches state 6, it transitions to state 8, holding the coefficient and read addresses constant, while writing the input data to the RAM 100. The sequencer then transitions back to state 5 to continue multiply and accumulate operations. If the done signal is also received while the sequencer is in state 6, the sequencer transitions to state 9 in order to scale the right and left accumulated values by the appropriate scale factor in states 9 and 7 respectively. If no input event is received and the done signal is received in state 6, the right accumulated value is scaled appropriately and the state machine transitions to state 7. Then, the left channel value is also scaled appropriately. The sequencer then returns to its idle state 0 after scaling the left channel value.

Implementation Using Programmable Integer ALU

To implement the above described circuits, actual hardware elements corresponding to the figures may be used. Preferably, a programmable structure with a single arithmetic logic unit (ALU) and a sequencer that implements the required computations is used. A programmable structure is preferred to reduce the area of an integrated circuit as well as to enable simple re-configuration. In the preferred embodiment, all of the low-pass filtering, shifting, divide and multiply operations (with the exception of the actual convolution filtering) are done in a programmable section.

Figure 24A:
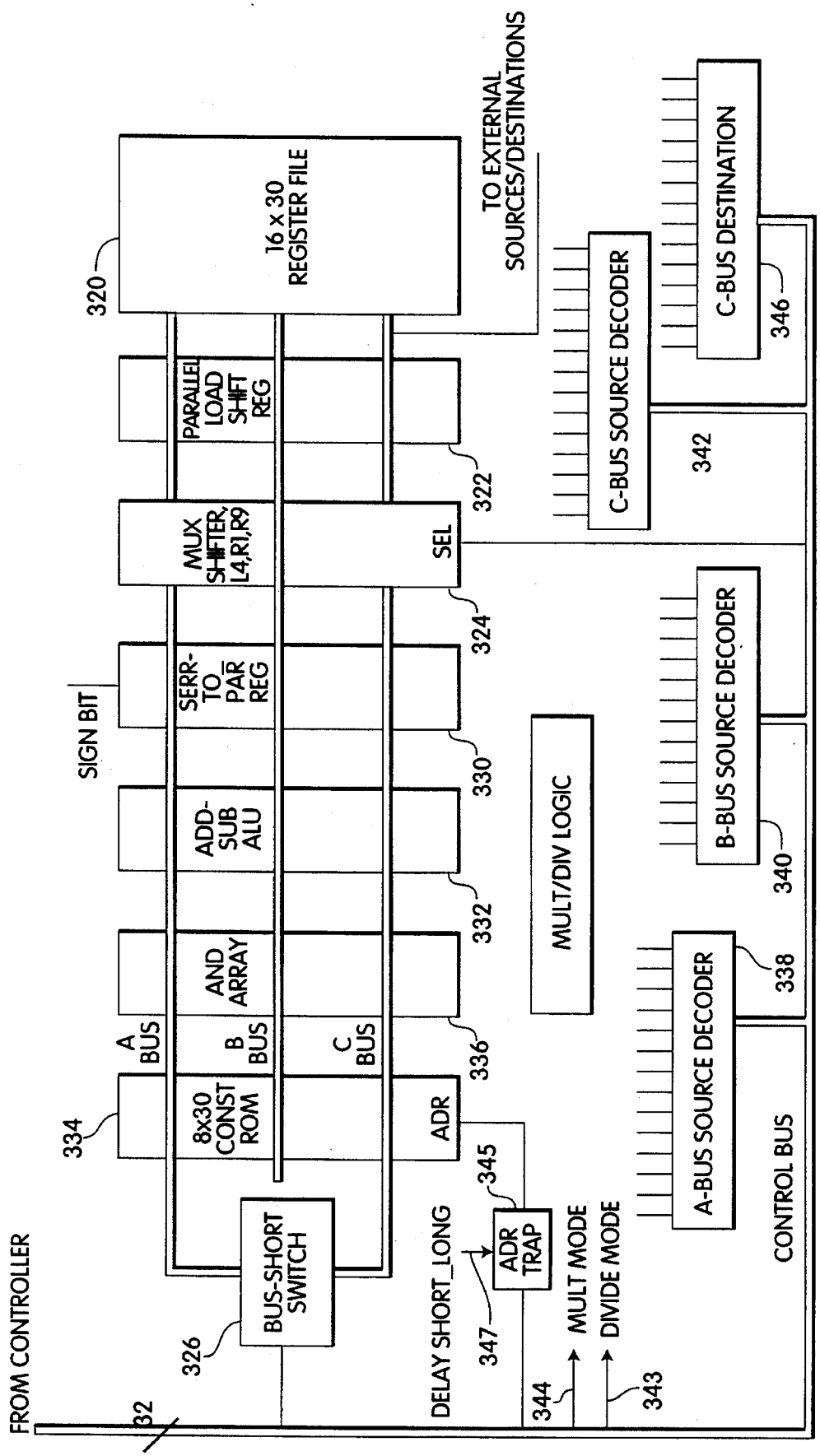
FIGS. 24A and 24B describe an integer arithmetic logic unit for use in a preferred embodiment of the invention.
Figure 24B:
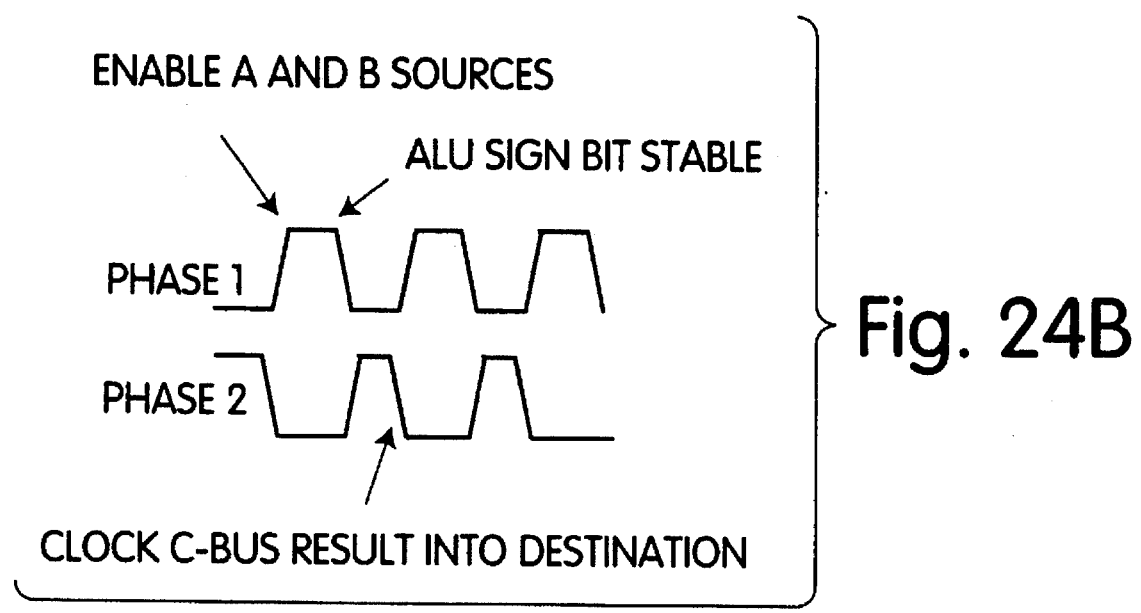

FIG. 24 shows a simplified architecture of a suitable programmable (arithmetic logic unit). The integer ALU is organized around 3 30-nit tri-state busses, an A, B, and C bus. The A and B busses are "source" busses, and the C bus is a "result" bus. During each cycle, one or more sources are enabled onto the A and B busses, and the result is clocked into the destination from the C bus. Another mode of operation occurs when data is loaded from external sources or written to external sources, both of which occurs over the C bus.

Referring to FIG. 24, there is a 16×30 register file 320 which holds intermediate results as well as certain filter states (e.g., from the latches of the multiplier-free filters) that are saved from one sequence of instructions to the next. Another general-purpose register 322 is provided that has a "shift right" mode. This register is used for shift-and-add multiply operations.

A mux-based shifter 324 is placed in series with all the general-purpose registers so that they may be enabled onto the A bus with a shift of right 1, right 9, and left 4. The shift-right-by-9 was included because there are three filtering operations where a divide by 512 is required. The other positions are used for general-purpose shifting. Arbitrary left-shifts are done by using the left-shift of 4, and then backing up by using the right-shift of 1. A register may be shifted by enabling it onto the A bus with a specified mux shift, selecting the "A-to-C shorting switch" 326 at the end of the datapath and writing the register back to itself. The mux shifter 324 has a "sign extension mode" input 328 that optionally extends the sign bit for 2's complement numbers in the right-shift mode. This allows division signed number by right-shifting.

A serial-to-parallel register 330 is included with the serial input 329 tied to the sign bit of the C result bus. This register 330 is used to hold the result of a divide iteration. An ADD/SUB ALU 332 is used as the main computational element in the datapath. It expects 2's complement inputs and produces a 2's complement output. A small 8×30 ROM block 334 is used in the ALU to store constants used operations for this embodiment. An AND array 336 is also included so that various sections of a long word may be masked by ANDing the word with a stored constant in the ROM 336.

The operation of the ALU is controlled by 5 fields in a 32-bit instruction word which indicate the A-BUS source, the B-BUS source, the C-BUS source, the C-BUS destination, and the ROM address. The bus source and destination fields are decoded by 1-of-16 decoders 338, 340 and 342 as shown in FIG. 24. ROM address are retrieved by the address trap 345. The C-bus destinator is determined by a decoder 346. Additional control lines 343, 344 are provided from the state machine sequencer to set up the various functions such multiply or divide modes.

In the upper corner of FIG. 24 is a timing diagram of the integer ALU. A two-phase clock is used. On the rising edge of phase 1, all selected A and B bus sources are enabled onto the bus. At the end of phase 1, the sign bit of the ALU must be stable for a multiply iteration to function properly. At the end of phase 2, the selected C-BUS destination register is clocked. The non-overlap nature of these clock provides a hold time for the destination register.

The preferred embodiment of the invention also has a delay mode which is determined by a constant that sets the offset between read and write addresses. Rather than design a complicated control structure, the address trap 345 was placed in series with the constant ROM 334. Assuming that the memory offset constant is stored in a particular location x, a simple logic circuit may detect when address x is applied to the ROM. If the "Delay Short_long" pin 347 is set to the "long" logic level, a new address Y can be substituted in place of x. In location Y the value of the memory offset for the "long delay" mode of the chip is stored.

Figure 25A:
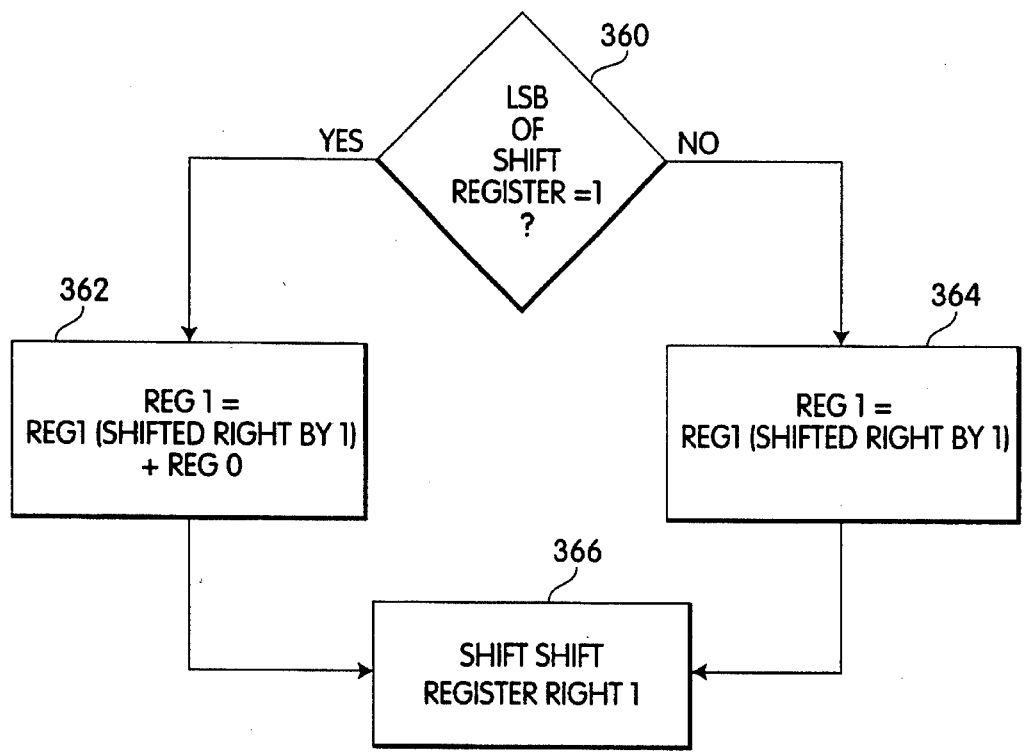
FIGS. 25A and 25B are flow charts describing multiply and divide operations implemented by the integer ALU of FIG. 24.

FIGS. 25A and B show flow diagrams for the multiply and divide operations performed by the integer ALU. For multiplication one of the operands in register REG0 of register 320 file, and the other in the shift-register 322. The output is stored in REG1 of register file 320. On every cycle, repeated for all bits in the shift-register, the LSB of the shift register is examined in step 360, and if this bit is a "1", the other operand (REG0) is added to the shifted result register (step 362). Otherwise, the result register is shifted right (using the mux shifter) (step: 364). After every operation, the shift register 322 is shifted (step 366). Each iteration takes only 1 machine cycle (one cycle of the master clock).

By shifting the results during computation the result word length is equal to the word length of the operands; that is, n bits x n bits=n bits. This is desirable when the multiply operation is viewed as two fractional operands with a fractional result. If the LSB's of the result are to be retained, the operation could simply be started with the operands right-justified in a 30-bit field instead of left-justified.

Figure 25B:
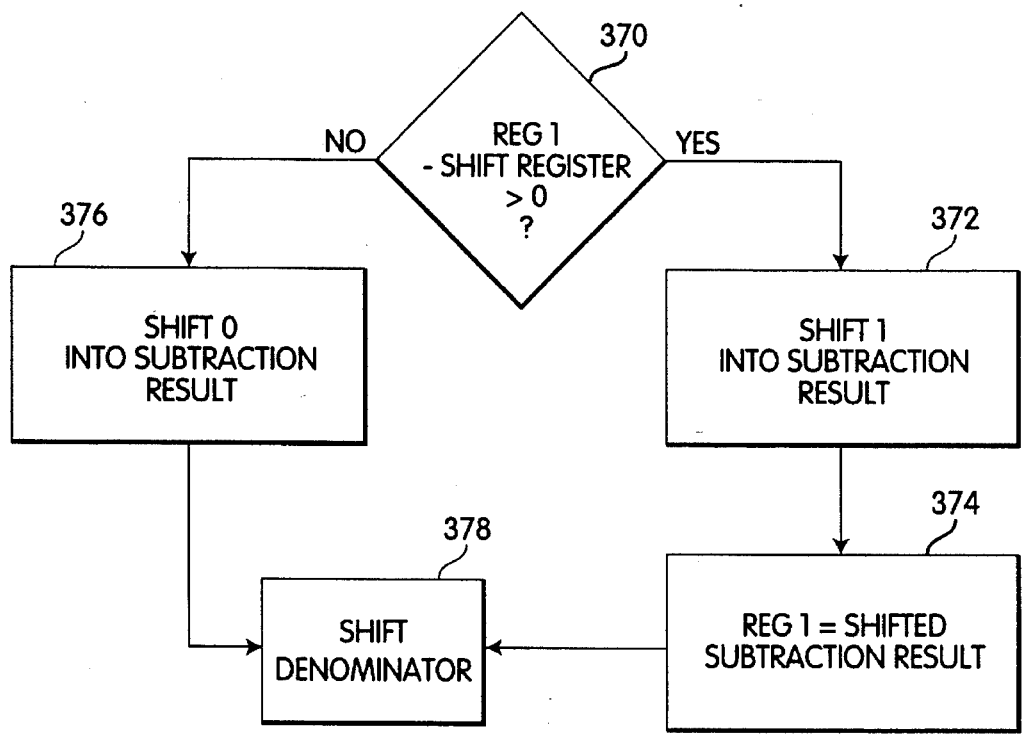

The divide operation (FIG. 25B) is a standard conditional subtraction algorithm. The numerator is loaded into a register REG1 in register file 320, and the denominator is loaded into the shift register 322. It is assumed that the numerator is smaller than the denominator. The denominator is then subtracted from the numerator. If the result stored in register 330 is greater than 0, as determined in step 370, then a "1" is shifted (step 372) into register 330, and the result of the subtraction is used to replace the numerator in REG1 of register file 320 (step 374). If the result is less than 0, a "0" is shifted (step 376) into register 330, and the numerator remains unchanged. In either case, the denominator is shifted right after each iteration (step 378). This divide operation takes two cycles per iteration. Special-purpose logic may be used to make the conditional register writes transparent to a controller for the ALU.

A controller for this ALU may be implemented using a read only memory with a counter driving its address inputs, and a small amount of control circuitry. The controller does not require any conditional branch capability. When a reset is applied, the controller begins executing from location 0 in the ROM, but after the first pass through the program, execution begins from location 16. This allows a section of the code to execute only on power-up. This feature is used to initialize the registers that represent internal filter states. By initializing these registers, the settling time of this embodiment is minimized upon the first application of input clocks.

The controller for the integer ALU begins the program execution every time an output sample request occurs. The controller then produces 130 sequential 32-bit control words until the "done" signal goes high and stops the address counter. The development of programs for such an ALU controller is well within the scope of ordinary digital designer skills.

The firmware, or the bit patterns in ROM, to control the integer ALU operation, are preferably prepared and loaded using an assembler that would take familiar machine instructions such as "ADD", "MOVE", "MULT", etc. and convert them to the bit patterns to be stored in the controller ROM. Development of such assemblers is well within the scope of one of ordinary skill in the art.

Figure 26:
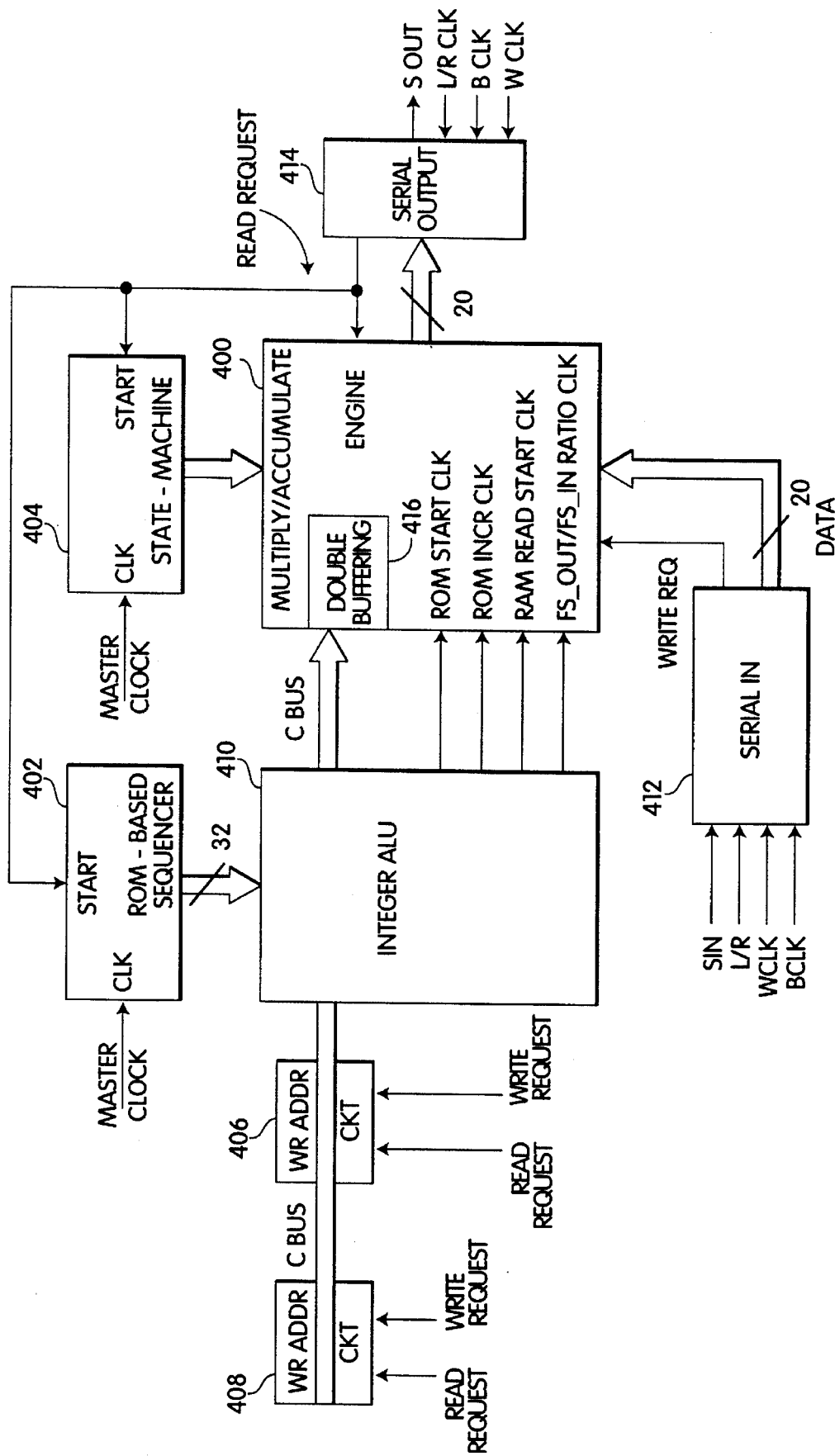
FIG. 26 is the complete block diagram of the preferred embodiment of the sample rate converter of the present invention.

FIG. 26 shows the overall system block diagram of the preferred embodiment. The system is divided primarily between a multiply-accumulate engine 400 and the integer ALU 410. Each has its own independent sequencer. For the integer ALU, the sequencer 402 is ROM-based; for the multiply-accumulate engine, the sequencer 404 is a state machine as described above. The circuit 406 which determines the output to input sample rate ratio, (except for low-pass filtering and limiting functions) and the write address interpolation circuit 408 are connected to the C-bus of the integer ALU 410. A serial-in buffer 412 and a serial-out buffer 414 convert data to and from serial and parallel data, and process read (output) and write (input) sample requests from outside sources.

A description of the sequence of events for generating output samples will now be provided.

A read request is signified by the toggling of the L/R clock on the serial output 414 causing the serial output 414 to set its "read request" line high. The "read request" signal begins the operation of both the integer ALU sequencer as well as the multiply-accumulate sequencer.

The integer ALU 410 determines the first coefficient address, an increment value, a read address start for the RAM, and the output to input sample rate ratio. Each of these values is written into a dedicated register in the multiply/accumulate engine 400.

Since the numbers that are supplied from the integer ALU take most of the available period to produce, the registers that store these numbers are "double-buffered". This means that when the multiply-accumulate engine 400 begins its sequence of operations, it can immediately read the second-level stage of the double-buffer 416, which contains valid results from the previous cycle. This enables the integer ALU computations to execute in parallel with the multiply-accumulate operations. The first-stage of the double-buffers is transferred to the second stage immediately after the "read request" line has gone high.

The integer ALU begins its operation by loading the external numbers from the circuit which determines the output to input sample rate ratio as well as the write address counter and the "interpolated write address" circuit described above. Near the end of the read request cycle, the four output values of the ALU mentioned previously are written into the first stage of the double buffer in the multiply-accumulate engine.

The multiply-accumulate engine proceeds in parallel to compute left and right outputs by multiplying the stored input data in RAM 100 with the ROM coefficients from ROM 104. At any time during this operation, an input word may appear in the serial input buffer 412, and the "write request" line will go high. The sequencer 404 in the multiply/accumulate section 400 will then temporarily suspend its operations and write the input word into the location addressed by the write counter. This does not affect the sample that is currently being computed, as the section of RAM 100 used for the convolution is centered as far as possible away from the write location. Thus, the current write location is not used to compute the currently requested output sample.

The serial output is also double-buffered, so that when an output sample is requested it is available immediately. At the end of a multiply-accumulate cycle, the result is stored in the first level of the serial-output double buffer. The output from the second level is provided as the output sample immediately upon receiving an output sample request.

Another feature which may be added to this embodiment is a detector circuit which detects when a new sample rate is provided for either the output or sample rates. In particular, this detector can detect when the read and write addresses cross or become within a certain threshold. The output of such detector could be used to signify that some output samples should be ignored.

It is also possible to provide two separate serial input interfaces which may be selectively used, for example, by using a multiplexer. Such an interface would allow for changes in input sample data to be made simply and quickly.

Other standard interface hardware may also be used. For example, circuitry could be provided to provide compatibility with the European I²S bus. Also, a signal could be used to indicate whether data would be provided on the rising edge of the word clock (W_clock) or a change in the L/R clock. When the L/R clock mode is selected, a word clock is not required. For serial output, the data is typically aligned with the falling edge of the bit clock. For the serial input, the data should be nominally aligned with the falling edge of the bit clock, but internally it is clocked on the rising edge of bit clock.

Having now described the preferred embodiment of the invention, it should be apparent to those skilled in the art that the foregoing is illustrative only and not limiting, having been presented by way of example only. Numerous other embodiments and modifications thereof could be made. For example, for applications involving lower sample rates, a conventional programmable digital signal processing chip could be used. These modifications are contemplated as falling within the scope of the present invention as defined by the appended claims and equivalents thereto.

What is claimed is:

1. An electronic device for producing a desired filter coefficient of a large set of filter coefficients for a digital filter, wherein each desired filter coefficient in the large set has a corresponding binary coefficient address in an address space defined by a number of taps of the digital filter, using a smaller set of coefficients stored in a memory element and a binary coefficient address in the address space and having a plurality of bits, said electronic device comprising:

a look-up table which maps the binary coefficient address to one of a plurality of regions of the address space, wherein an average first-order difference between adjacent filter coefficients corresponding to binary coefficient addresses in each region is substantially constant, wherein the look-up table has an input for receiving the binary coefficient address and an output providing an indication of the region corresponding to the binary coefficient address;

a shifter connected to receive a portion of the least significant bits of the binary coefficient address and for shifting the portion by an amount determined by the region indicated by the output of the look-up table to provide a shifter output;

means for combining the output of the look-up table with a portion of the most significant bits of the shifter output to produce an address N to access the memory element;

means for accessing the memory element to obtain a first coefficient ROM(N) from the smaller set using the address produced by the means for combining;

means for accessing the memory element to obtain a second coefficient ROM(N+1) from the smaller set using an address adjacent to the address produced by the means for combining;

means for generating an interpolation number INTERP, having a number K of bits from low-order bits of the shifter output; and means, connected to both the means for accessing and the means for generating, for performing a linear interpolation to obtain the desired filter coefficient wherein the desired filter coefficient is equal to ROM(N)+ (ROM(N+1)−ROM(N))*(INTERP/$2^K$).

2. An electronic device for producing a desired filter coefficient of a large set of filter coefficients for a digital filter, wherein each desired filter coefficient in the large set has a corresponding binary coefficient address in an address space defined by a number of taps of the digital filter, using a smaller set of coefficients stored in a memory element and a binary coefficient address in the address space and having a plurality of bits, wherein desired filter coefficients corresponding to only even addresses are stored in the memory element, and differences between adjacent filter coefficients in the memory element are stored in a difference memory, said electronic device comprising:

a look-up table which maps the binary coefficient address to one of a plurality of regions of the address space, wherein an average first-order difference between adjacent filter coefficients corresponding to binary coefficient addresses in each region is substantially constant, wherein the look-up table has an input for receiving the binary coefficient address and an output providing an indication of the region corresponding to the binary coefficient address;

a shifter connected to receive a portion of the bits of the least significant bits of the binary coefficient address and for shifting the portion by an amount determined by the region indicated by the output of the look-up table to provide a shifter output;

means for combining the output of the look-up table with a portion of most significant bits of the shifter output to produce an address N to access the memory element;

means for accessing the memory element to obtain a first coefficient ROM(N) from the smaller set using the address produced by the means for combining;

means for accessing the difference memory to obtain a difference DIFFROM(N) using the address produced by the means for combining;

means for generating an interpolation number INTERP, having a number K of bits from low-order bits of the shifter output; and means for performing a linear interpolation to obtain the desired filter coefficient wherein the desired filter coefficient is equal to ROM(N)+DIFF ROM(N)*(INTERP/$2^K$), when the binary coefficient address is in between binary coefficient addresses corresponding to filter coefficients ROM(N) and ROM(N+1), and wherein the desired filter coefficient is equal to ROM(N)+DIFF ROM(N−1)*((INTERP/$2^{K-1}$), when the binary coefficient address is in between binary coefficient addresses corresponding to filter coefficients ROM(N−1) and ROM(N).

3. An electronic device for use with a digital filter for producing a desired filter coefficient for the digital filter selected from a reduced set of filter coefficients, each desired filter coefficient having a corresponding coefficient address in an address space defined by a number of taps of the digital filter, comprising:

an address folder having an input for receiving a coefficient address and an output providing a corresponding equivalent address for a symmetrically related filter tap;

means for mapping a number of the most significant bits of the output of the address folder to provide a reduced coefficient address and a shift control output;

a barrel shifter having a data input connected to a number of the least significant bits of the output of the address folder, a shift control input connected to the shift control output of the means for mapping and an output;

a coefficient memory having an input connected to the output of the means for mapping and the most significant bits of the output of the barrel shifter and providing a output coefficient in response to the input;

a difference memory having an input connected to the output of the means for mapping and the most significant bits of the output of the barrel shifter and providing a difference value in response to the input; and an arithmetic unit that determines a fractional value according to the least significant bits of the output of the barrel shifter, computes the product of the difference value and the fractional value and that adds the computed product to the output coefficient to provide the desired filter coefficient.

* * * * *